United States Patent
Li et al.

(10) Patent No.: US 9,799,831 B2
(45) Date of Patent: Oct. 24, 2017

(54) P-TYPE SEMICONDUCTING POLYMERS AND RELATED METHODS

(71) Applicant: AGENCY FOR SCIENCE, TECHNOLOGY AND RESEARCH, Singapore (SG)

(72) Inventors: Jun Li, Singapore (SG); Kok Haw Ong, Singapore (SG); Zhikuan Chen, Singapore (SG); Yujun Zhao, Singapore (SG); Siew Lay Lim, Singapore (SG); Ivy Wong, Singapore (SG); Lee Yang, Singapore (SG); Kang Yee Seah, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/655,716

(22) PCT Filed: Dec. 27, 2013

(86) PCT No.: PCT/SG2013/000558
§ 371 (c)(1),
(2) Date: Jun. 25, 2015

(87) PCT Pub. No.: WO2014/104979
PCT Pub. Date: Jul. 3, 2014

(65) Prior Publication Data
US 2015/0349257 A1    Dec. 3, 2015

Related U.S. Application Data

(60) Provisional application No. 61/746,917, filed on Dec. 28, 2012.

(51) Int. Cl.
*H01L 51/00* (2006.01)
*C09D 5/24* (2006.01)
(Continued)

(52) U.S. Cl.
CPC .......... *H01L 51/0036* (2013.01); *C08G 75/32* (2013.01); *C09D 5/24* (2013.01);
(Continued)

(58) Field of Classification Search
CPC ...................................... H01L 51/00
(Continued)

(56) References Cited

U.S. PATENT DOCUMENTS

2010/0331550 A1    12/2010  Moawia et al.

FOREIGN PATENT DOCUMENTS

CN    102060982 A    5/2011
CN    102660000 A    9/2012
(Continued)

OTHER PUBLICATIONS

Iain McCulloch, et al., "Liquid-Crystalline Semiconducting Polymers with High Charge-Carrier Mobility", Nature Materials, vol. 5, pp. 328-332, (Apr. 2006).
(Continued)

*Primary Examiner* — Duc Truong
(74) *Attorney, Agent, or Firm* — Blakely, Sokoloff, Taylor & Zafman LLP

(57) ABSTRACT

There is provided p-type organic polymers of general formula I. The polymers may be useful as semi-conducting material. Thus, thin films and devices comprising such polymers are also provided.

9 Claims, 16 Drawing Sheets

Scheme 1:

(51) Int. Cl.
| | |
|---|---|
| C08G 75/32 | (2006.01) |
| H01L 51/42 | (2006.01) |
| C08G 75/00 | (2006.01) |
| C08G 61/12 | (2006.01) |
| C08K 3/04 | (2006.01) |

(52) U.S. Cl.
CPC ...... *H01L 51/0002* (2013.01); *H01L 51/0043* (2013.01); *H01L 51/4253* (2013.01); *C08G 61/123* (2013.01); *C08G 61/126* (2013.01); *C08G 2261/124* (2013.01); *C08G 2261/143* (2013.01); *C08G 2261/1412* (2013.01); *C08G 2261/3142* (2013.01); *C08G 2261/3223* (2013.01); *C08G 2261/3246* (2013.01); *C08G 2261/364* (2013.01); *C08G 2261/414* (2013.01); *C08G 2261/91* (2013.01); *C08K 3/04* (2013.01); *H01L 51/0007* (2013.01); *H01L 51/0037* (2013.01); *H01L 2251/308* (2013.01); *Y02E 10/549* (2013.01)

(58) Field of Classification Search
USPC .......................................................... 528/377
See application file for complete search history.

(56) References Cited

FOREIGN PATENT DOCUMENTS

| JP | 2009158921 A | 7/2009 |
|---|---|---|
| JP | 2013131716 A | 7/2013 |
| KR | 1020100040695 A | 4/2010 |
| WO | WO 2006/021277 A1 | 3/2006 |
| WO | WO 2007/126929 A2 | 11/2007 |
| WO | WO 2009/105042 A1 | 8/2009 |
| WO | WO 2010/048319 A1 | 4/2010 |
| WO | WO 2011/025453 A1 | 3/2011 |
| WO | WO 2011/156478 A2 | 12/2011 |
| WO | WO 2013/015298 A1 | 1/2013 |

OTHER PUBLICATIONS

Yuning Li, et al., "Poly(2,5-bis(2-thienyl)-3,6-dialkylthieno[3,2-b]thiophene)s—High-Mobility Semiconductors for Thin-Film Transistors", Advanced Materials, vol. 18, pp. 3029-3032, (2006).
Yuning Li, et al., "A High Mobility P-Type DPP-Thieno[3,2-b]thiophene Copolymer for Organic Thin-Film Transistors", Advanced Materials, vol. 22, pp. 4862-4866, (2010).
Yuning Li, et al., "Poly(2,5-bis(2-octyldodecyl)-3,6-di(furan-2-yl)-2,5-dihydro-pyrrolo[3,4-c]-pyrrole-1,4-dione-co-thieno[3,2-b]thiophene): A High Performance Polymer Semiconductor for Both Organic Thin Film Transistors and Organic Photovoltaics", Phys. Chem. Chem. Phys., vol. 14, pp. 7162-7169, (2012).
Shiming Zhang, et al., "Low Bandgap π-Conjugated Copolymers Based on Fused Thiophenes and Benzothiadiazole: Synthesis and Structure-Property Relationship Study", Journal of Polymer Science: Part A: Polymer Chemistry, vol. 47, pp. 5498-5508, (2009).
Ming Wang, et al., "Donor-Acceptor Conjugated Polymer Based on Naphtho[1,2-c:5,6-c]bis[1,2,5]thiadiazole for High-Performance Polymer Solar Cells", J. Am. Chem. Soc., vol. 133, pp. 9638-9641, (2011).
Jian-Ming Jiang, et al., "Crystalline Low-Band Gap Polymers Comprising Thiophene and 2,1,3-Benzooxadiazole Units for Bulk Heterojunction Solar Cells", Macromolecules, vol. 44, pp. 9155-9163 (2011).
PCT Notification of Transmittal of the International Search Report and the Written Opinion of the International Searching Authority, or the Declaration for counterpart PCT Application No. PCT/SG2013/000558, 17 pp., (Mar. 21, 2014).
PCT International Preliminary Report on Patentability (Chapter II of the Patent Cooperation Treaty) for counterpart PCT Application No. PCT/SG2013/000558, 7 pp., (Nov. 27, 2014).
Response to Written Opinion for the PCT Written Opinion of the International Searching Authority mailed on Mar. 21, 2014 for counterpart PCT Application No. PCT/SG2013/000558, 55 pp., (Oct. 28, 2014).
Joong Suk Lee, et al., "Importance of Solubilizing Group and Backbone Planarity in Low Band Gap Polymers for High Performance Ambipolar field-effect Transistors", Chem. Mater., vol. 24, pp. 1316-1323, (2012).
Johan C. Bijleveld, et al., "Copolymers of Diketopyrrolopyrrole and Thienothiophene for Photovoltaic Cells", J. Mater. Chem., vol. 21, pp. 9224-9231, (2011).
Laure Biniek, et al., "Electronic Properties and Photovoltaic Performances of a Series of Oligothiophene Copolymers Incorporating Both Thieno[3,2-b]thiophene and 2,1,3-Benzothiadiazole Moieties", Macromol. Rapid Commun., vol. 31, pp. 651-656, (2010).
Laure Biniek, et al., "A [3,2-b]thienothiophene-alt-benzothiadiazole Copolymer for Photovoltaic Applications: Design, Synthesis, Material Characterization and Device Performances", J. Mater. Chem., vol. 19, pp. 4946-4951, (2009).
Laure Biniek, et al., "Impact of the Alkyl Side Chains on the Optoelectronic Properties of a Series of Photovoltaic Low-Band-Gap Copolymers", Macromolecules, vol. 43, pp. 9779-9786, (2010).
Zheng Bang Lim, et al., "New Moderate Bandgap Polymers Containing Alkoxysubstituted-Benzo[c][1,2,5]thiadiazole and Thiophene-Based Units", Journal of Polymer Science, Part A: Polymer Chemistry, vol. 49, pp. 4387-4397, (2011).
Jang Yong Lee, et al., "Synthesis and Characterization of 2,1,3-benzothiadiazole-thieno[3,2-b]thiophene-based Charge Transferred-Type Polymers for Photovoltaic Application", Solar Energy Materials and Solar Cells, vol. 93, pp. 1932-1938, (2009).
Taiwan IP Office of Ministry of Economic Affairs, Official Letter dated May 26, 2017 for corresponding Taiwan Application No. 102148700, with Search Report, with English translation, 14 pages.

*Scheme 1:*

*Scheme 2:*

*Scheme 3:*

*Scheme 4:*

*Scheme 5:*

Scheme 6:

Scheme 7:

*Scheme 8:*

*Scheme 9:*

*Scheme 10:*

*Scheme 11:*

*Scheme 12:*

*Scheme 13:*

Scheme 14:

P-TYPE SEMICONDUCTING POLYMERS AND RELATED METHODS

CROSS-REFERENCE TO RELATED APPLICATIONS

This patent application is a U.S. National Phase Application under 35 U.S.C. §371of International Application No. PCT/SG2013/000558, filed on Dec. 27, 2013, entitled P-TYPE SEMICONDUCTING POLYMERS AND RELATED METHODS, which claims benefit of, and priority from, U.S. provisional application Ser.No. 61/746,917, filed on Dec. 28, 2012, the contents of which were incorporated by reference.

FIELD OF THE INVENTION

The present invention relates to p-type organic polymers useful as semi-conducting material and devices comprising such polymers.

BACKGROUND OF THE INVENTION

The growing demand for energy throughout the world has placed great emphasis on the exploration of new sources of energy. Harvesting energy directly from sunlight using photovoltaic cells is recognized as an important solution to the growing energy crisis and environmental pollution.

Bulk heterojunction (BHJ) polymer solar cells, comprising interpenetrating networks of a donor polymer semiconductor and a fullerene derivative acceptor such as [6,6]-phenyl-$C_{61}$-butyric acid methyl ester ($PC_{61}BM$), have attracted a great deal of attention by virtue of their easy solution processability, mechanical flexibility, and the low-cost large-area manufacturing.

Materials innovation is one of the major forces currently driving the performance of polymer solar cells (PSCs). The efficiency of a PSC is given by $\eta = V_{OC} \times J_{SC} \times FF$, where $V_{OC}$ is the open circuit voltage, $J_{SC}$ is the short circuit current, and FF is the fill factor. Improvement of any of these three factors yields a higher efficiency. The key focus areas of polymer design include engineering the bandgap and energy levels to achieve high $J_{SC}$ and $V_{OC}$, enhancing planarity to attain high carrier mobility, and materials processability and stability.

Research efforts focus on improving the power conversion efficiency (PCE) of devices. PCE is a measure of how much power can be generated from a device, and thus directly affects the cost of the device. Current organic photovoltaic materials and devices typically exhibit a PCE of about 5-8%, which is still lower than the general goal of 10% PCE which is often sought for devices that are to be mass produced. As well, efforts have been made to improve processability of materials used in device fabrication.

All of the aforementioned design focus areas are inter-related. In an ideal case, all factors should be optimized in a single polymer, but this remains a significant challenge. Organic photovoltaic (OPV) devices based on an ideal material are predicted to have a power conversion efficiency (PCE)>10% based on theoretical models, provided a suitable low bandgap donor material is available.

As a result, polymers used for organic photovoltaic devices application are typically designed with the tendency to form ordered structures in films to facilitate charge transporting within the devices. In order to form an ordered structure in thin films, the polymer chains should be as planar as possible.

Solution processing is one advantage of organic electronics, especially for OPV, which allows the OPV cells/modules to be manufactured through high throughput low cost roll-to-roll processing. Due to the high degree of ordered packing, the current light harvesting materials used in organic photovoltaic devices normally require solvents with very a high boiling point, for example chlorobenzene or dichlorobenzene, for ink formulation and device fabrication. These solvents tend to be toxic as well as environmentally unsafe. Thus, to date, very few polymers can be printed, either due to poor solubility or the requirement for particular solvents, many of which are considered environmentally hazardous.

SUMMARY OF THE INVENTION

The polymers described herein are p-type semi-conducting polymers, suitable for use as conducting material in photoactive electronic devices, including in organic photovoltaic devices (OPVs). The polymers have been designed to attempt to improve power conversion efficiency of the electronic devices. As well, the polymers have been designed to attempt to improve solution processability for device fabrication.

The polymers described herein have been designed to introduce some large dihedral angles within the polymer chain.

The inclusion of some larger dihedral angles between groups in the polymers described herein disturbs the effective conjugation of the polymer chain, resulting in a shorter conjugation length along the polymer backbone. Since the polymer conjugation length is affected, thus the absorption spectrum and HOMO energy levels of the polymers are also affected. As a result, the lower HOMO levels of the p-type polymers of the invention may allow for manufacture of electronic devices with a photoactive layer, such as OPVs, having higher open circuit voltages.

The large dihedral angles also serve to interrupt the planarity of the molecules; typically, planarity (and thus low dihedral angles) is seen as desirable as it increases order between polymer chains within a thin film. Polymers typically designed to be planar are well ordered in terms of packing and thus have reduced solubility in common organic solvents. However, in the polymers of the invention, the inclusion of groups with large dihedral angles within the polymers may improve solubility by interrupting the ordered packing, increasing solvation and thus allowing for use of less toxic solvent systems for solution processing.

The polymers thus may be formulated into inks using environmentally friendly solvent systems, to assist with device fabrication.

The polymers may be blended with suitable acceptor materials, such as fullerene derivatives, for example [6,6]-phenyl-$C_{60}$-butyric acid methyl ester ($PC_{61}BM$) or [6,6]-phenyl-$C_{70}$-butyric acid methyl ester ($PC_{71}BM$), to form devices such as solar cells.

In one aspect, the invention provides a polymer of formula I:

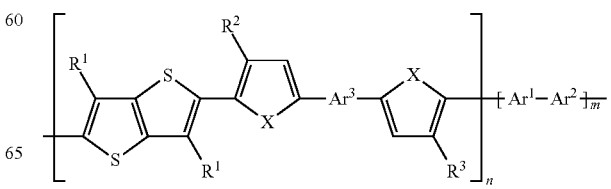

In formular I, Ar¹ and Ar² are either both absent, or both present and Ar¹ is selected from:

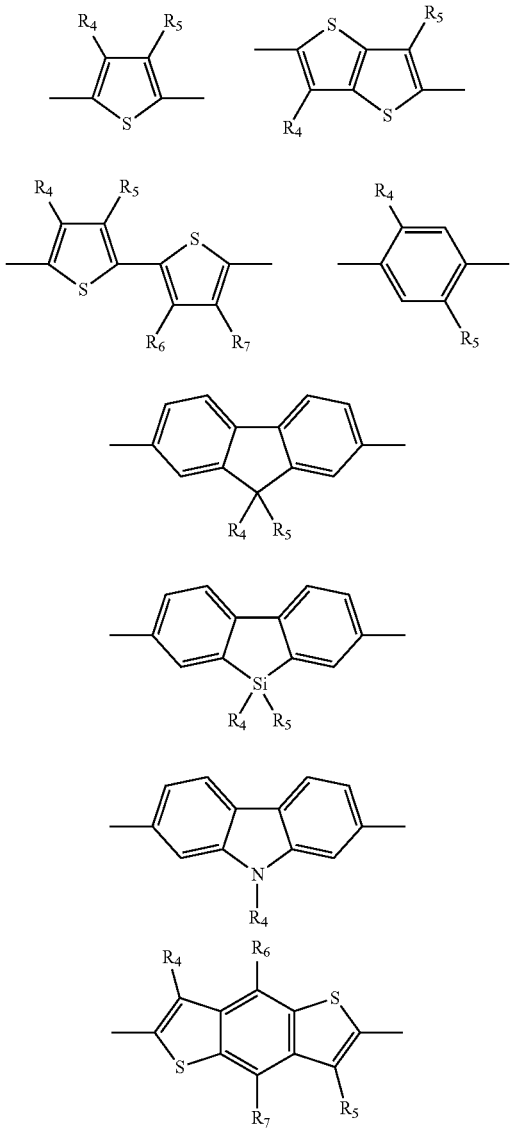

Ar² is selected from:

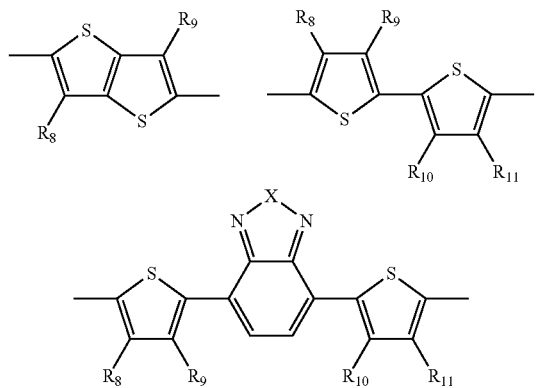

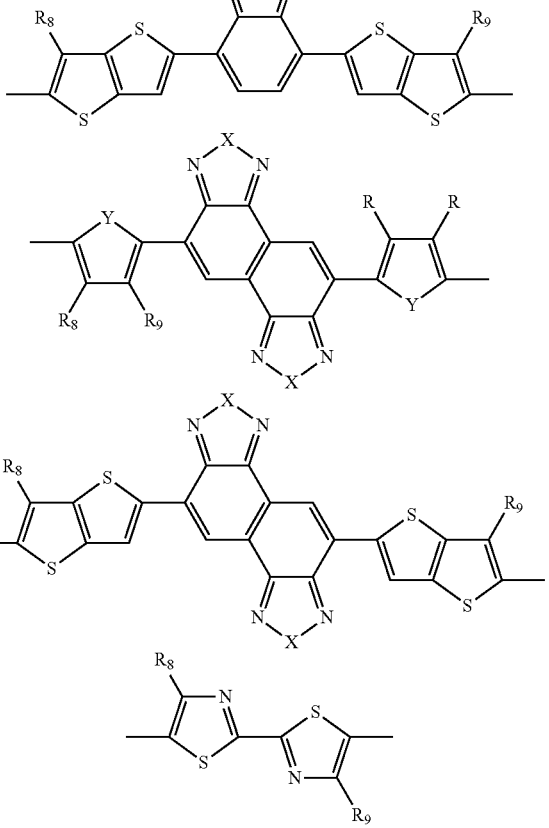

Ar³ is selected from

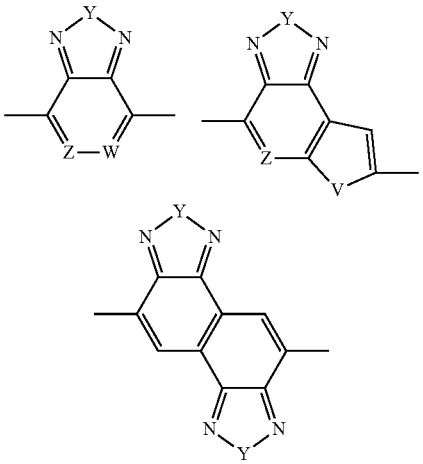

V is selected from O, S, N, Se, C—R¹², C═C, C═N and N═C; X and Y are each independently selected from O, S, Se and N; W and Z are each independently selected from C—R¹² and N.

Each occurrence of R¹ (of 2n total occurrences) is each independently selected from H, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms.

Each occurrence of each of R, $R^4$, $R^5$, $R^6$, $R^7$, $R^8$, $R^9$, $R^{10}$ and $R^{11}$ (of m or 2m total occurrences) is each independently selected from straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms.

Each occurrence of $R^2$, $R^3$ and $R^{12}$ (of n total occurrences) is each independently selected from H, halide, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms.

n is an integer from 10 to 1000; and in is 0 when $Ar^1$ and $Ar^2$ are both absent, or when $Ar^1$ and $Ar^2$ are both present, m is an integer from 1 to 1000 and the ratio of m:n is from about 0.01 to about 1.

In some embodiments, $Ar^1$ and $Ar^2$ are both present and the monomers containing $Ar^3$ and the monomers containing $Ar^1$ and $Ar^2$ are randomly arranged in the polymer. In other embodiments, $Ar^1$ and $Ar^2$ are both present and the monomers containing $Ar^3$ and the monomers containing $Ar^1$ and $Ar^2$ are arranged in blocks in the polymer. In still other embodiments, $Ar^1$ and $Ar^2$ are both absent and $R^1$ is not H. In still other embodiments, $Ar^1$ and $Ar^2$ are both absent and $R^1$ and at least one of $R^2$ and $R^3$ are not H. In still other embodiments, $Ar^1$ and $Ar^2$ are both absent and $R^1$, $R^2$ and $R^3$ are not H.

In some embodiments, the polymer has formula I-1:

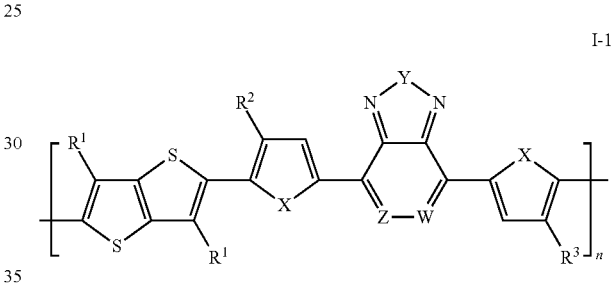

The polymer may have one of the following formulas:

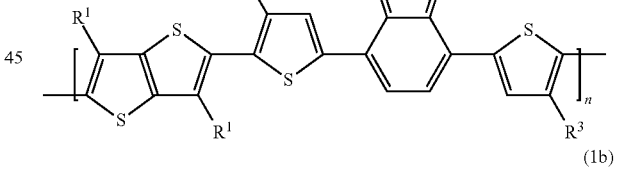

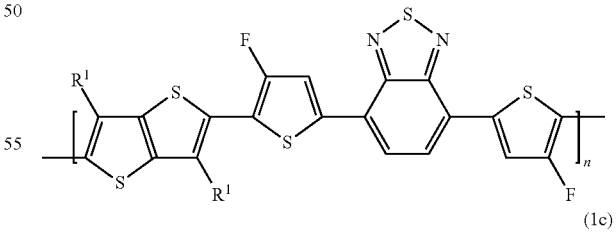

-continued
(1d)
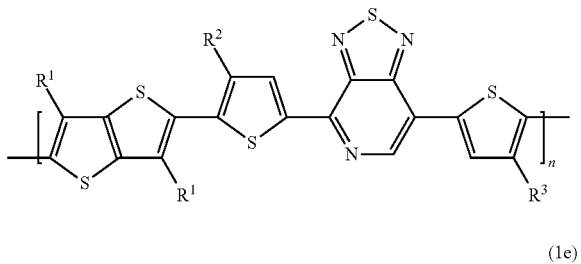
(1e)
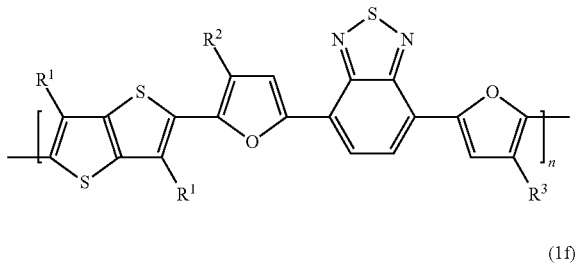
(1f)
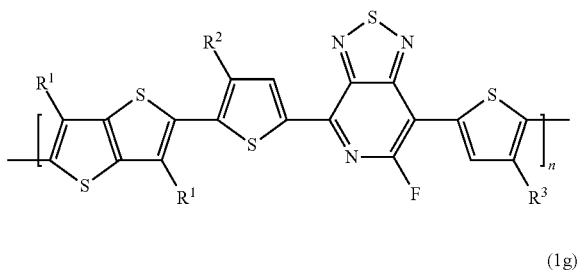
(1g)
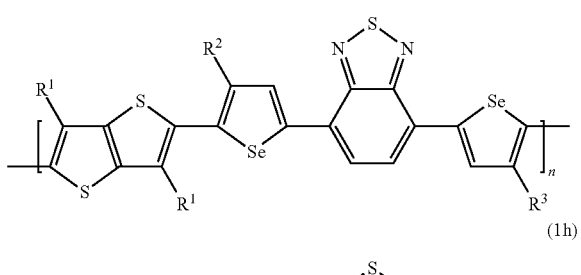
(1h)
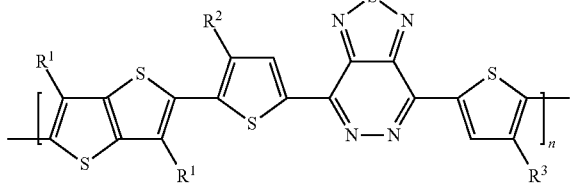
In some embodiments, the polymer has formula I-2:
I-2
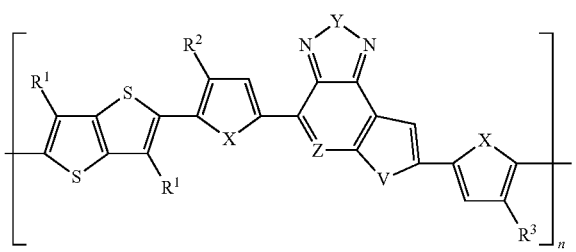
The polymer may have one of the following formulas:
(2a)
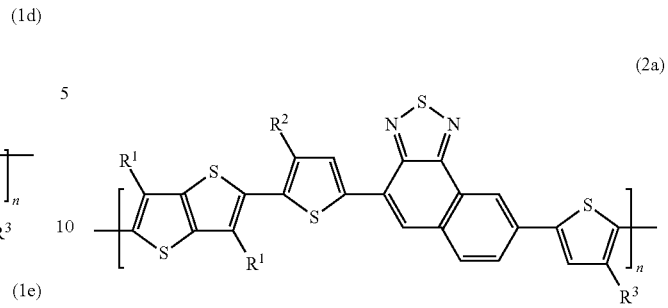
(2b)
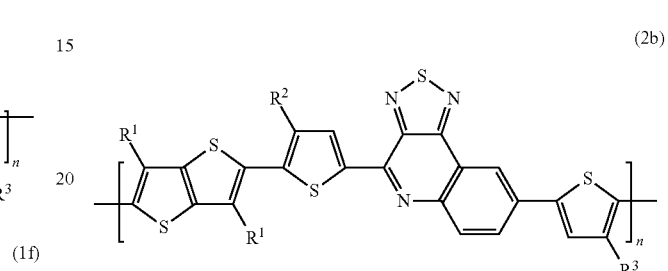
(2c)
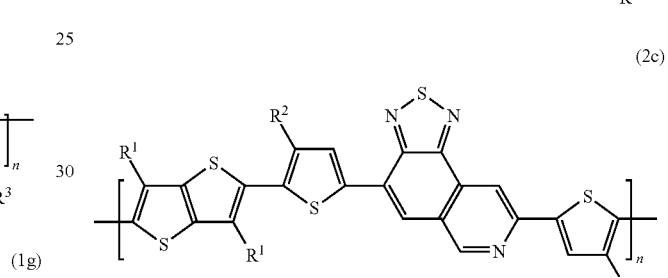
(2d)
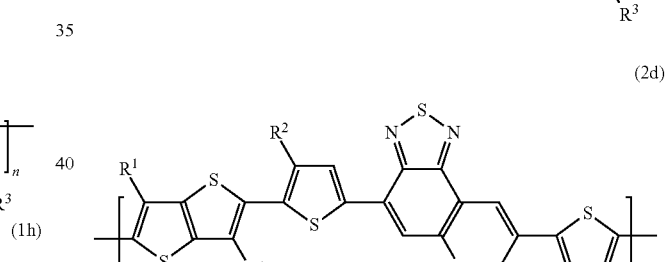
(2e)
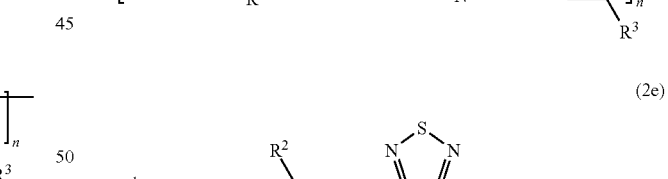
(2f)
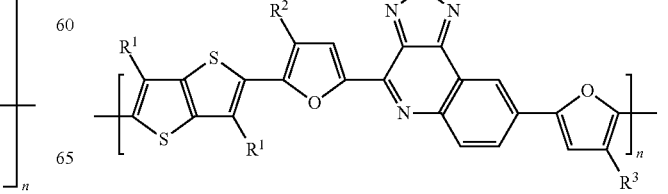

-continued
(2g)
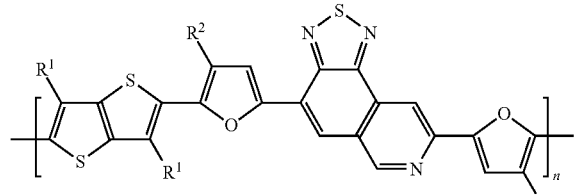
(2h)
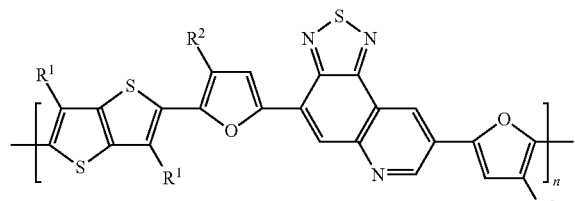
(2i)
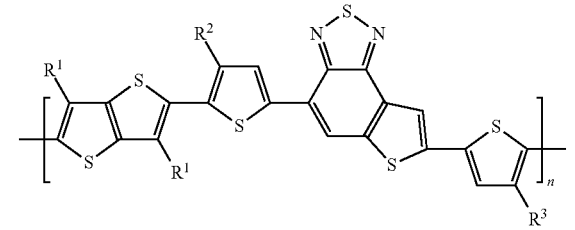
(2j)
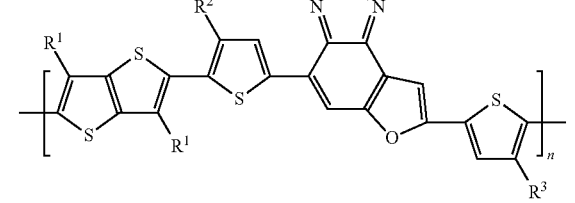
(2k)
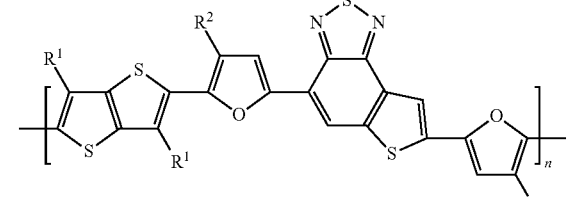
(2l)
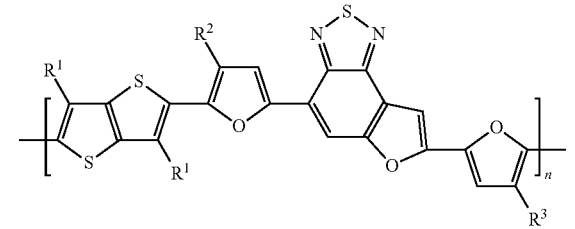
In some embodiments, the polymer has formula I-3:
I-3
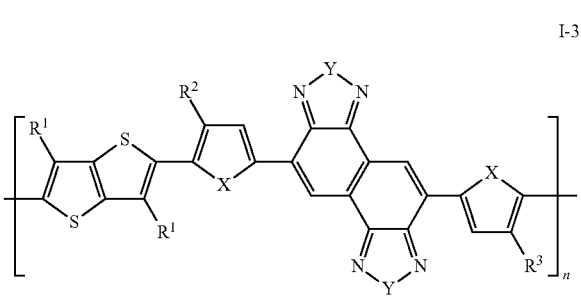
The polymer may have one of the following formulas:
(3a)
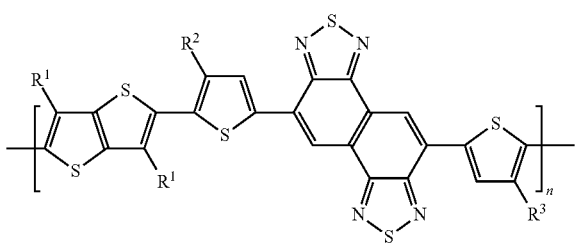
(3b)
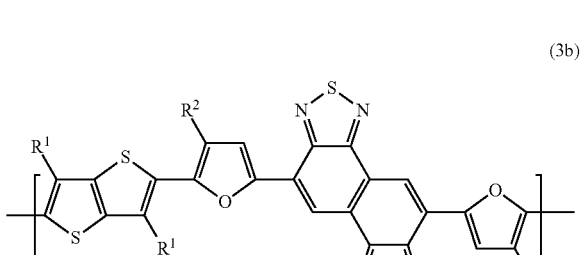
(3c)
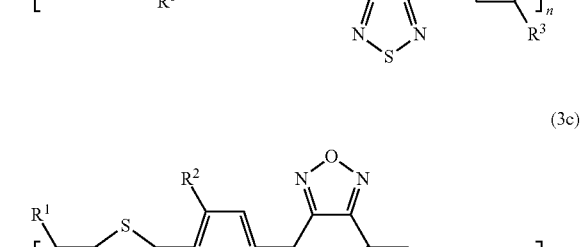
(3d)
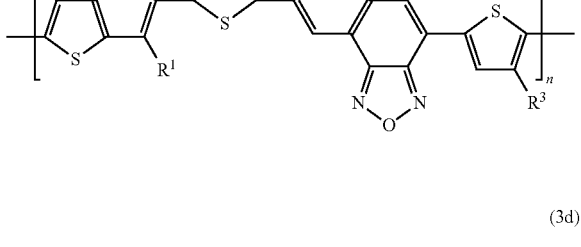

In some embodiments, the polymer has formula I-4:
(I-4)
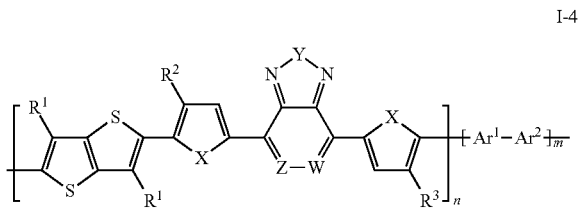
The polymer may have one of the following formulas:
(4a)
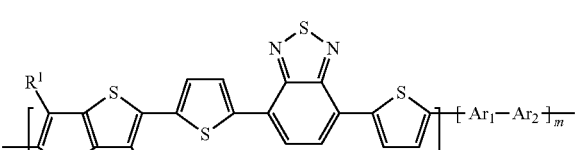
(4b)
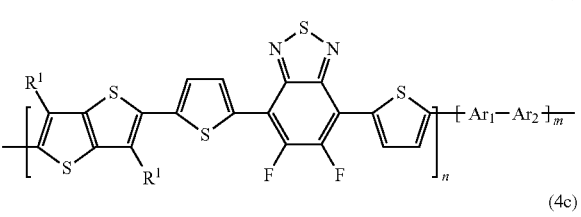
(4c)
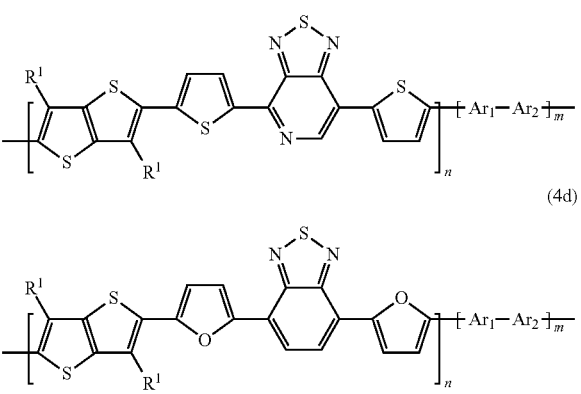
(4d)
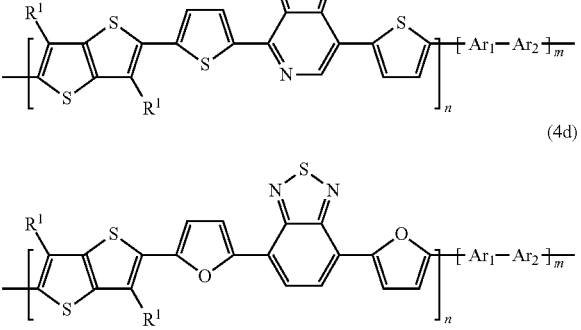
(4e)
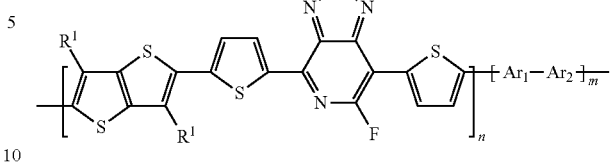
(4f)
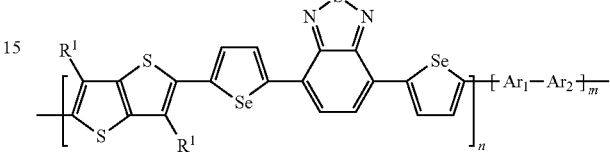
(4g)
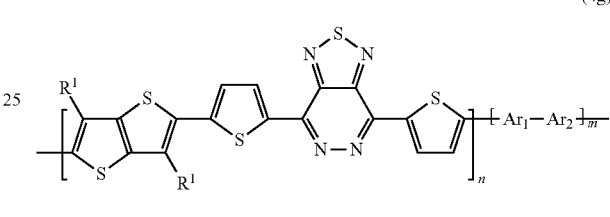
In some embodiments, the polymer has formula I-5:
(I-5)
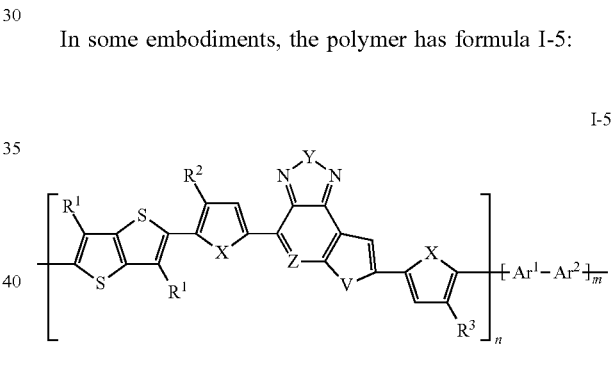
The polymer may have one of the following formulas:
(5a)
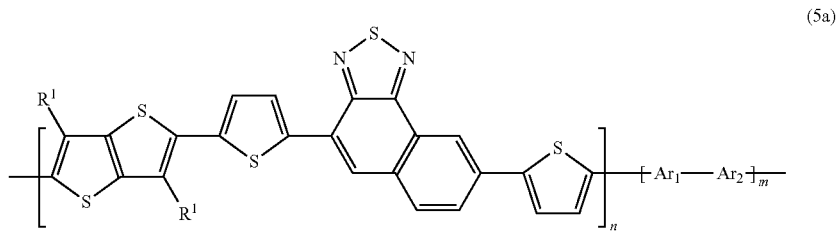
(5b)
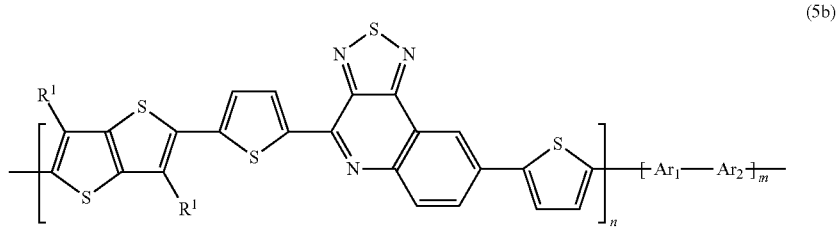

-continued
(5c)
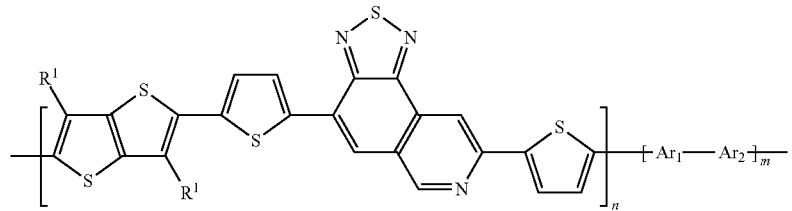
(5d)
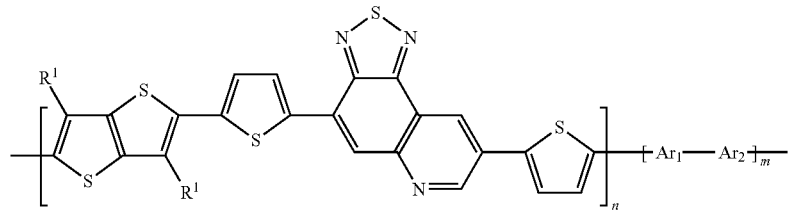
(5e)
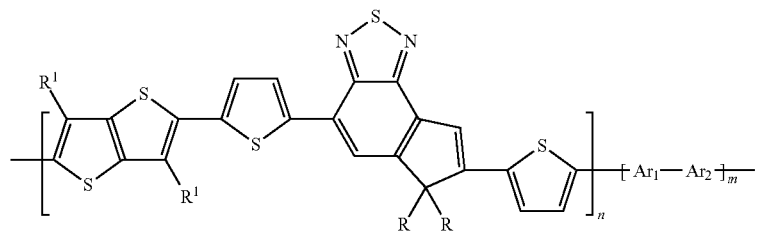
R: alkyl group, or R, R=O
(5f)
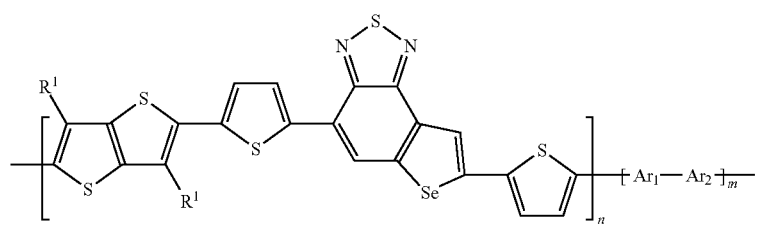
(5g)
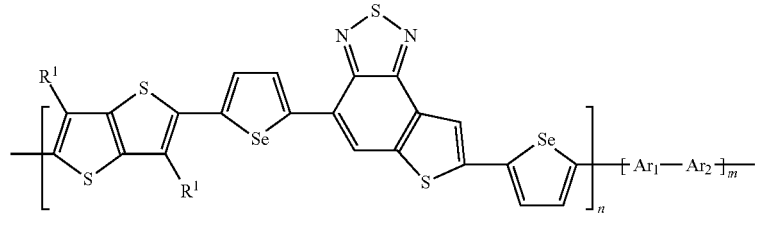
(5h)
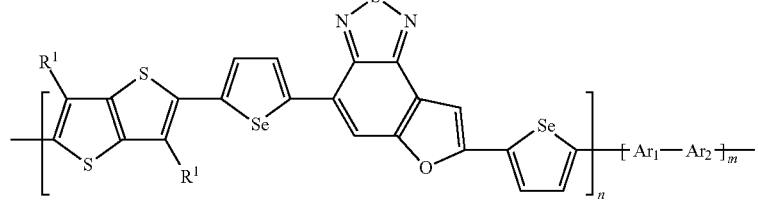
(5i)
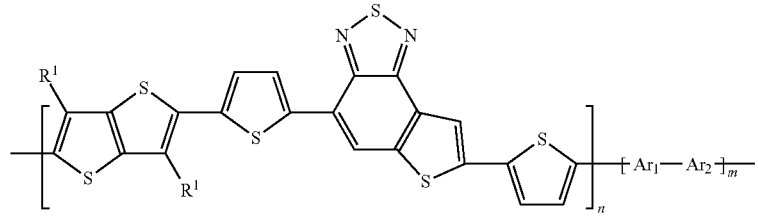

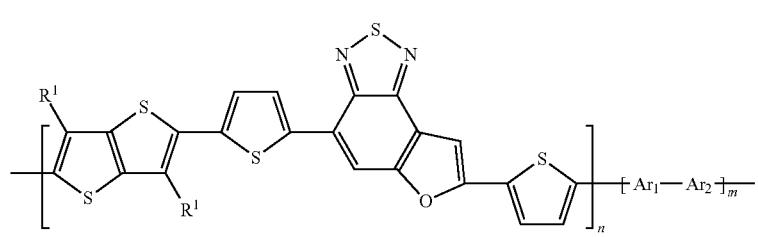

(5j)

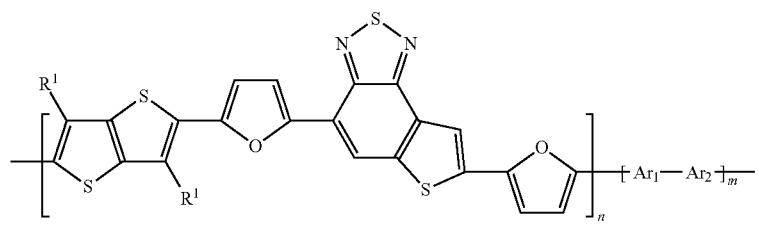

(5k)

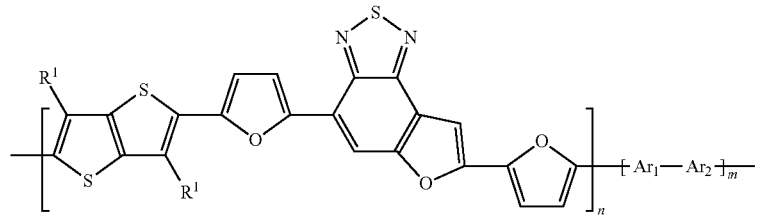

(5l)

In some embodiments, the polymer has formula I-6:

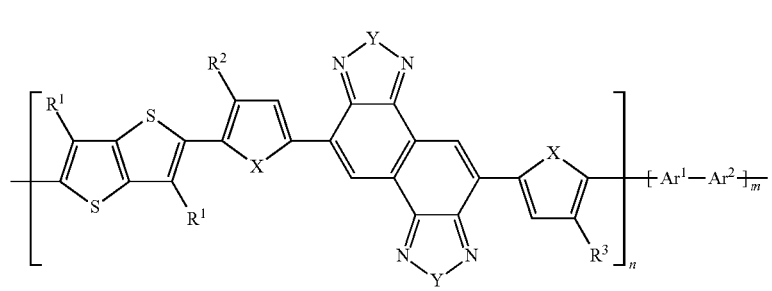

I-6

The polymer may have one of the following formulas:

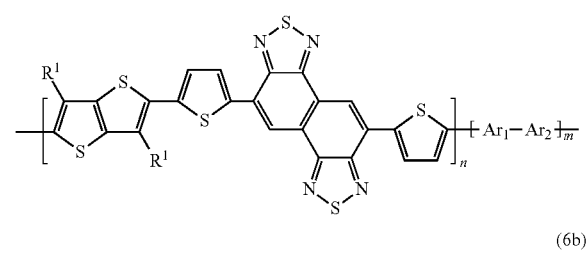

(6a)

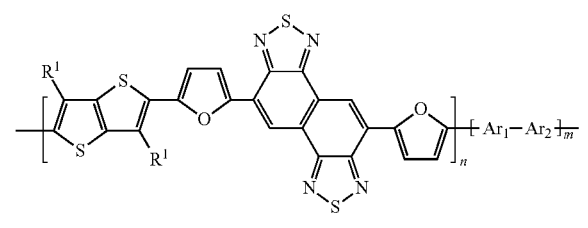

(6b)

In another aspect, the invention provides a halogen-free solvent having a dispersion parameter of about 18 to about 20, a hydrogen bonding parameter of about 2 to about 4, and a polarity parameter of about 0.5 to about 6.5.

The solvent may comprise tetralin, indane or o-xylene. In some embodiments, the solvent comprises a mixture selected of tetralin:salicylaldehyde in a ratio of about 99.9:0.1 to about 90:10, a mixture of tetralin:methyl salicylate in a ratio of about 99.9:0.1 to about 90:10, a mixture of indane:salicylaldehyde in a ratio of about 99.9:0.1 to about 90:10 or a mixture of o-xylene:salicylaldehyde in a ratio of about 99.9:0.1 to about 90:10.

In another aspect, there is provided a solution comprising a polymer of the invention dissolved in a halogen-free solvent of the invention.

In another aspect, there is provided a thin film comprising a polymer of the invention.

The thin film may further comprise an n-type acceptor material, including for example [6,6]-phenyl-$C_{60}$-butyric acid methyl ester (PC61BM), [6,6]-phenyl-$C_{70}$-butyric acid methyl ester (PC71BM), 2-vinyl-4,5-dicyanoimidazoles, or a perylene tetracarboxylic diimide.

In another aspect, there is provided an organic electronic device comprising a photoactive layer, the photoactive layer comprising a polymer of the invention.

The organic electronic device may comprise an organic photovoltaic cell having normal or inverted architecture, an organic thin film transistor, a photodiode, a light-emission diode, or a sensor including a chemical sensor, a biosensor or a biochemical sensor.

The organic electronic device may comprise a polymeric electrolyte interlayer between the photoactive layer and a cathode. In some embodiments, the polymeric electrolyte interlayer comprises a polymer electrolyte selected from:

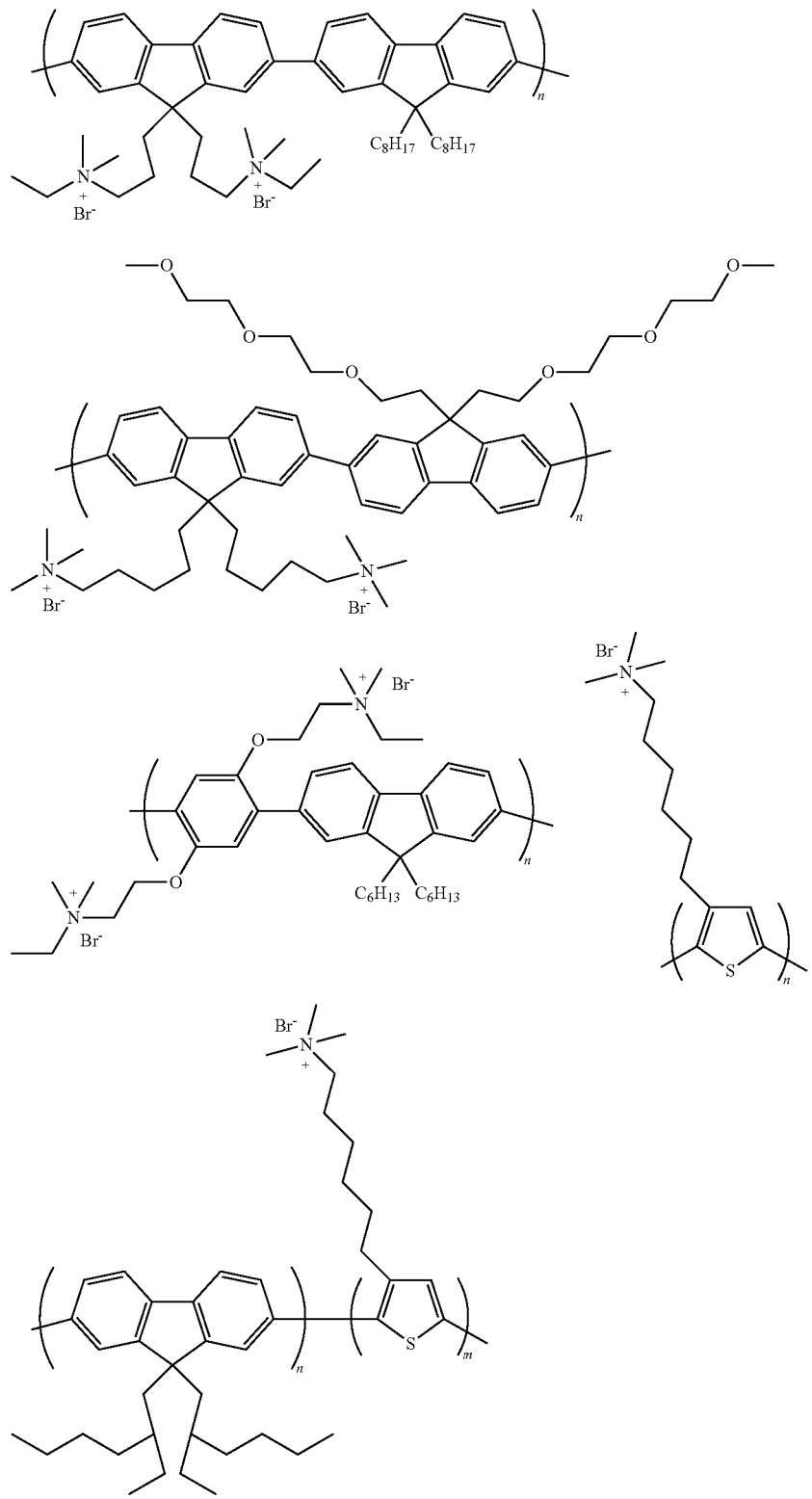

In the above formulas for the polymer electrolyte, m and n are integers independently selected from 10 to 1000.

In another aspect, there is provided a process for forming a thin film of the invention, the process comprising: dissolving a polymer of the invention in a halogen-free solvent to form a solution of the invention; applying the solution to a substrate; and allowing the solution to dry to form a thin layer comprising the polymer.

The thin layer may be included in an organic electronic device, including an organic electronic device of the invention.

In the process, the solution may be applied to the substrate by spin coating, spray coating, slot die coating, blade coating, inkjet printing, or gravure printing.

Other aspects and features of the present invention will become apparent to those of ordinary skill in the art upon review of the following description of specific embodiments of the invention in conjunction with the accompanying figures and tables.

BRIEF DESCRIPTION OF THE DRAWINGS

The figures, which illustrate, by way of example only, embodiments of the present invention, are as follows.

DETAILED DESCRIPTION

Figure 1:
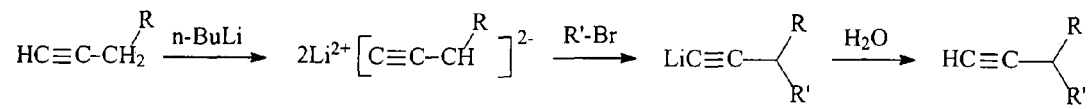
FIG. 1. Reaction scheme for synthesis of 3-alk-1-ynes.
Figure 2:
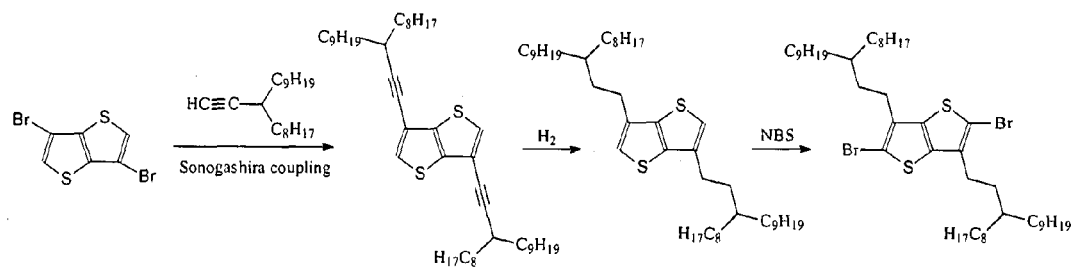
FIG. 2. Reaction scheme for synthesis of 2,5-dibromo-3,6-bis(3-octyldodecyl)thieno[3,2-b]thiophene.
Figure 3:
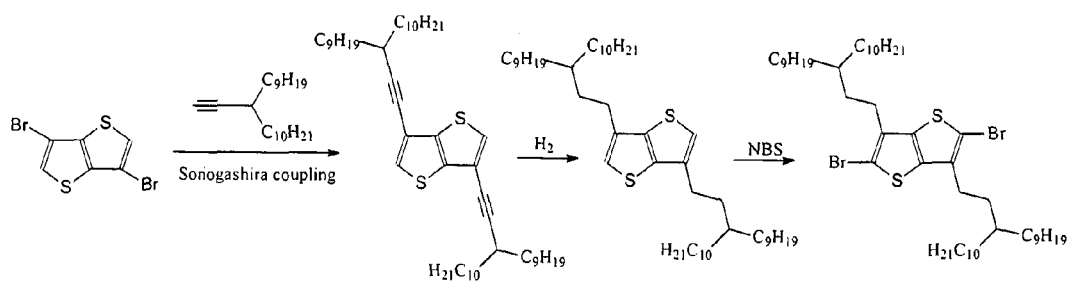
FIG. 3. Reaction scheme for synthesis of 2,5-dibromo-3,6-bis(3-nonyltridecyl)thieno[3,2-b]thiophene.
Figure 4:
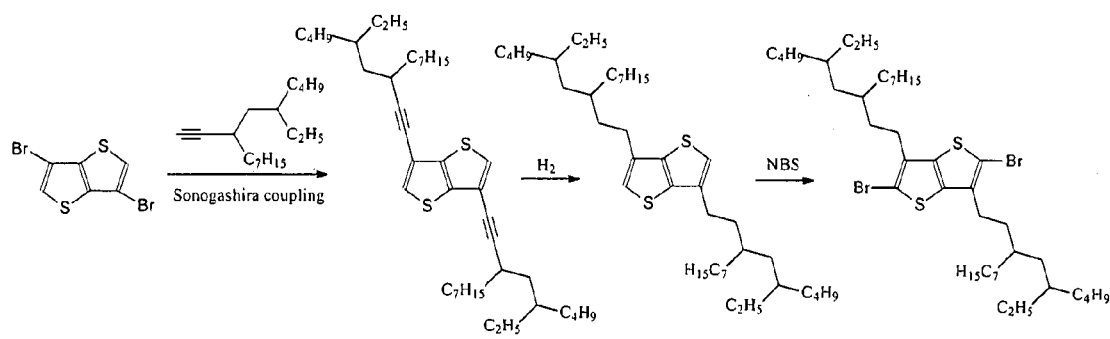
FIG. 4. Reaction scheme for synthesis of 2,5-dibromo-3,6-bis(3-(2-ethylhexyl)decyl)thieno[3,2-b]thiophene.
Figure 5:
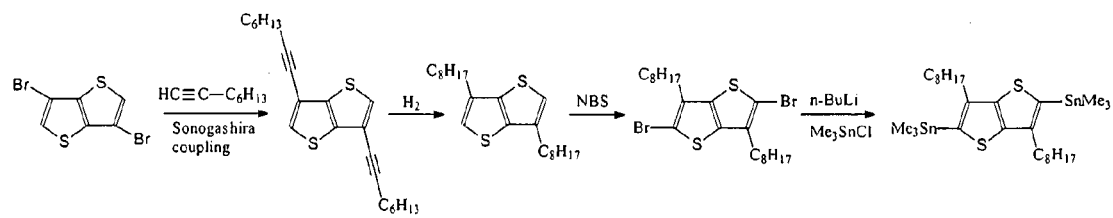
FIG. 5. Reaction scheme for synthesis of 2,5-bis(trimethylstannyl)-3,6-dioctylthieno[3,2-b]thiophene.
Figure 6:
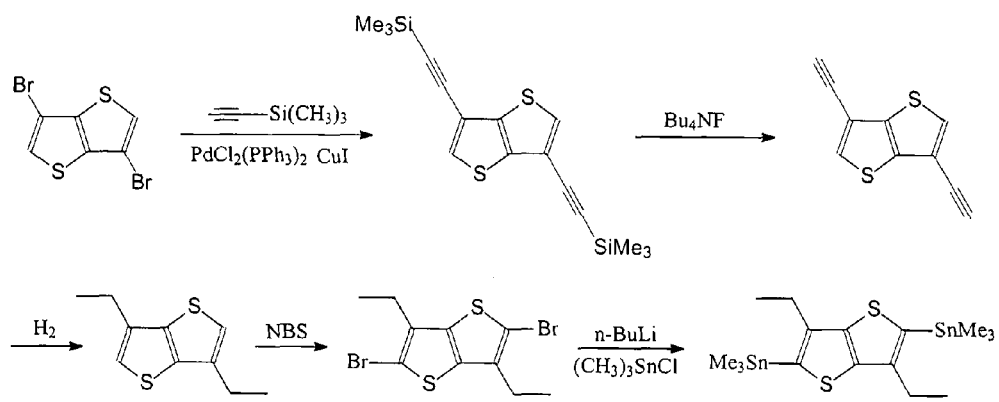
FIG. 6. Reaction scheme for synthesis of 2,5-bis(trimethylstannyl)-3,6-diethylthieno[3,2-b]thiophene.
Figure 7:
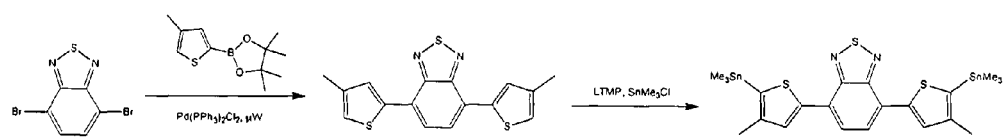
FIG. 7. Reaction scheme for synthesis of 4,7-bis(2-trimethylstannyl-3-methylthien-5-yl)-2,1,3-benzothiadiazole.
Figure 8:
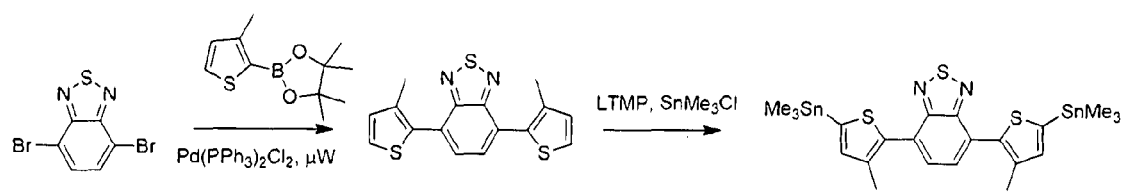
FIG. 8. Reaction scheme for synthesis of 4,7-bis(2-trimethylstannyl-4-methylthien-5-yl)-2,1,3-benzothiadiazole.
Figure 9:
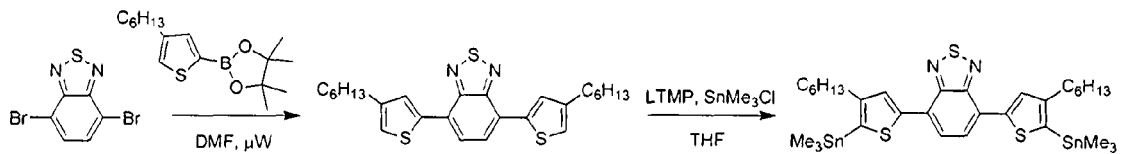
FIG. 9. Reaction scheme for synthesis of 4,7-bis(2-trimethylstannyl-3-hexylthien-5-yl)benzo-2,1,3-thiadiazole.

There are provided p-type semi-conducting polymers of formula I, as described herein. The polymers may be useful as semi-conducting material in electronic devices such as organic photovoltaics, organic thin film transistors, photodetectors and chemical sensors.

The polymers are designed to be low bandgap polymers, and may thus provide good charge transfer when incorporated into a device. The polymers may also exhibit improved solubility, which may allow for formulation into polymer inks for printing, thus assisting with fabrication of devices.

The polymers of formula I comprise thienothiophene groups and are designed to have certain dihedral angles between cyclic groups along the backbone that are relatively large, thus interrupting planarity of the molecules. As a result, packing between polymer chains is less ordered and compact, and the conductive path along the polymer backbone has been shortened.

In the polymers as described herein, the p-type semi-conducting polymer has a formula as set out in formula I, as shown below and as set out in the following specifically exemplified formulas I-1, 1a-1h, I-2, 2a-2l, I-3, 3a-3-d, I-4, 4a-4g, I-5, 5a-5l, I-6, 6a-6b.

In formula I, the presence of sidechains at positions $R^1$, and optionally $R^2$ and $R^3$, or the presence of $Ar^1$ and $Ar^2$ groups, provides the large dihedral angles included in the polymer. Thus, substituent $R^1$ represents a sidechain that is not hydrogen, or $Ar^1$ and $Ar^2$ groups are present, or both. In formula I, when present, $R^1$, $R^2$ and $R^3$ (non-hydrogen) substituents, and/or $Ar^1$ and $Ar^2$ groups, help to enhance the processability of the polymer for solution processed organic electronics device application. In some embodiments falling within formula I, when $Ar^1$ and $Ar^2$ groups are absent, $R^1$ is not H. In some embodiments, $R^1$, $R^2$ and $R^3$ are all H and $Ar^1$ and $Ar^2$ are present.

Substitution on the $Ar^1$ and $Ar^2$ groups when present may also result in a large dihedral angle between adjacent $Ar^1$ and $Ar^2$ groups or between an $Ar^1$ group and an adjacent aromatic group with substitution in head-to-head linkage or between an. $Ar^2$ group and an adjacent thienothienylene group with substitution in head-to-head linkage.

In formula I, each definition listing options for the various substituents also includes any sublist falling within the larger list. As well, any range given for the number of atoms in a group includes any subrange falling within the larger range. As well, reference to branched groups includes reference to cyclic groups.

Thus, there is provided a polymer of formula I:

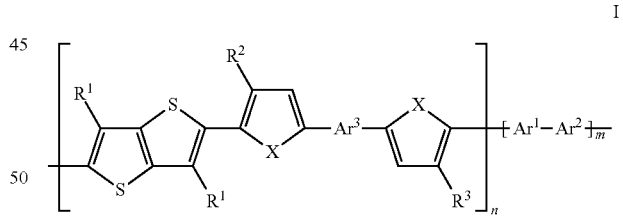

In formula 1, $Ar^1$ and $Ar^2$ are either (i) both absent, or (ii) both present. If $Ar^1$ and $Ar^2$ are both absent, then in some embodiments, $R^1$ is not H. If $Ar^1$ and $Ar^2$ are both present, then any or all of $R^1$, $R^2$ and $R^3$ may be H.

When both $Ar^1$ and $Ar^2$ are present, $Ar^1$ is selected from the following groups:

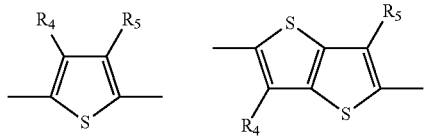

-continued

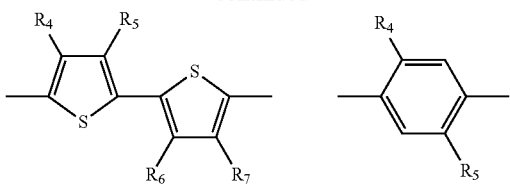

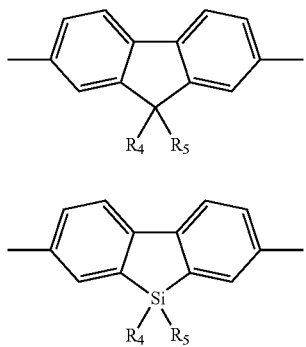

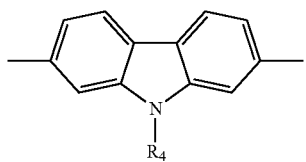

When both Ar¹ and Ar² are present, Ar² is selected from the following groups:

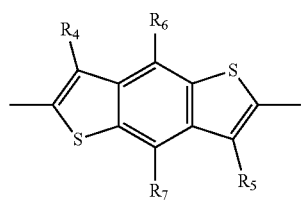

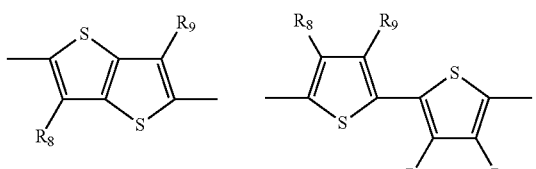

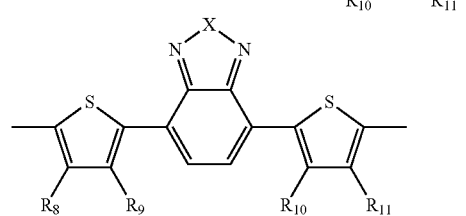

-continued

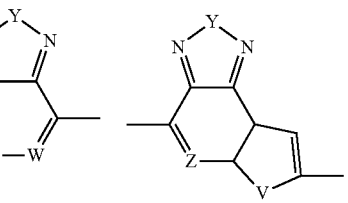

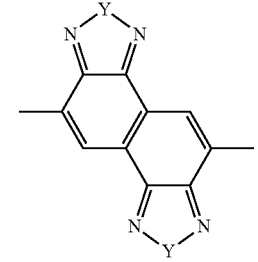

In formula I, Ar³ is selected from the following groups:

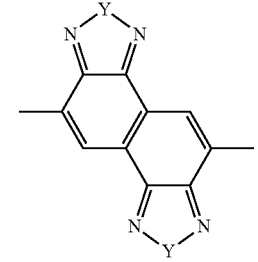

In formula I, V is selected from O, S, N, Se, C including C—R$^{12}$, C=C, C=N and N=C;

X and Y are each independently selected from O, S, Se and N; and

W and Z are each independently selected from C including C—R$^{12}$, and N.

In formula I, each occurrence of R¹ (of 2n total occurrences) is independently selected from H, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms.

In formula I, each occurrence of each of R, $R^4$, $R^5$, $R^6$, $R^7$, $R^8$, $R^9$, $R^{10}$ and $R^{11}$ (of m or 2m total occurrences for each) is independently selected from straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms.

In formula I, each occurrence of each of $R^2$, $R^3$ and $R^{12}$ (of n total occurrences for each) is independently selected from H, halide, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms.

In formula I, n is an integer from 10 to 1000, or any specific value or subrange falling within this range; and m is 0 when $Ar^1$ and $Ar^2$ are both absent, or when $Ar^1$ and $Ar^2$ are both present, m is an integer from 1 to 1000, or any specific value or subrange falling within this range, and the ratio of m:n is from about 0.01 to about 1 or any specific value or subrange falling within this range.

In some embodiments of the polymer of formula I, $Ar^1$ and $Ar^2$ are both present and the monomers containing $Ar^3$ and the monomers containing $Ar^1$ and $Ar^2$ are randomly arranged in the polymer.

In some embodiments of the polymer of formula I, $Ar^1$ and $Ar^2$ are both present and the monomers containing $Ar^3$ and the monomers containing $Ar^1$ and $Ar^2$ are arranged in blocks in the polymer.

The polymer of formula I may have the formula I-1:

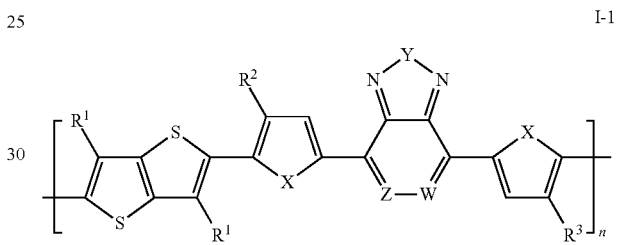

I-1

The polymer of formula I may have one of the following formulas:

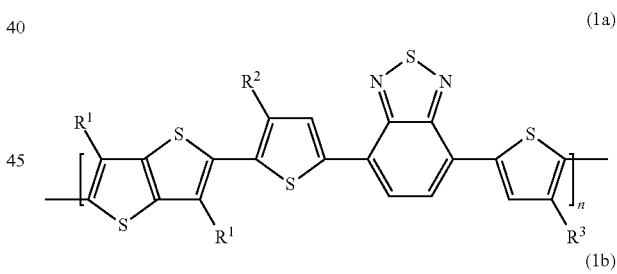

(1a)

(1b)

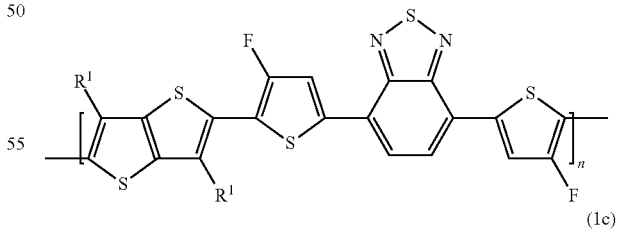

(1c)

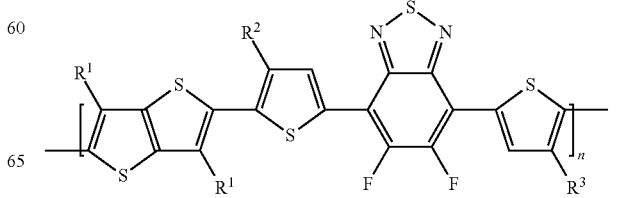

-continued
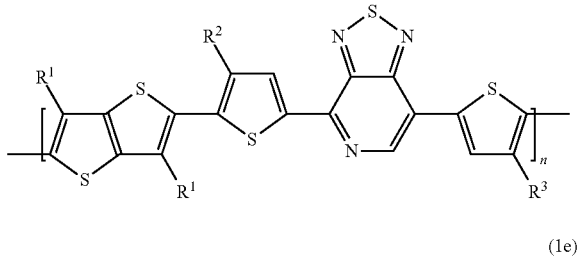
(1d)
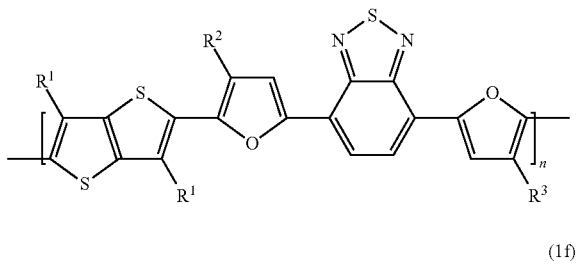
(1e)
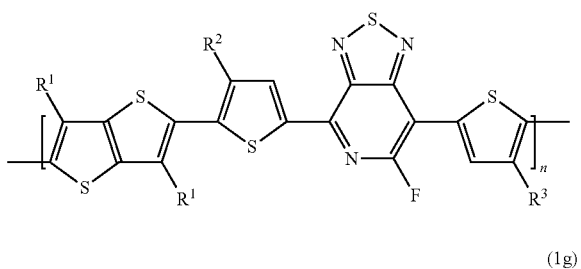
(1f)
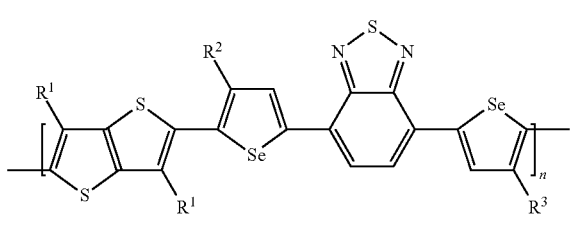
(1g)
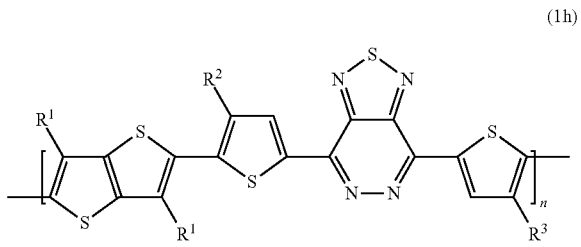
(1h)
The polymer of formula I may have the formula I-2:
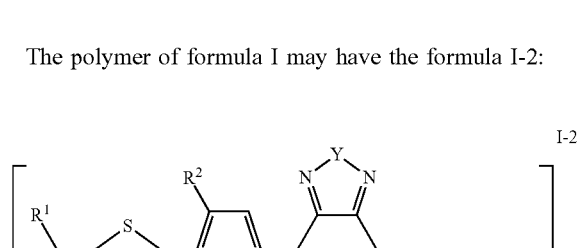
I-2
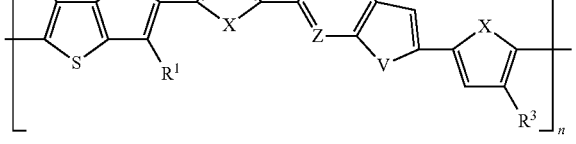
The polymer of formula I may have one of the following formulas:
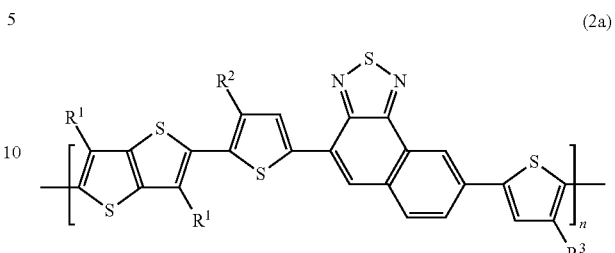
(2a)
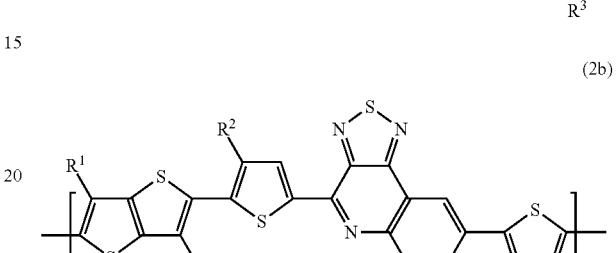
(2b)
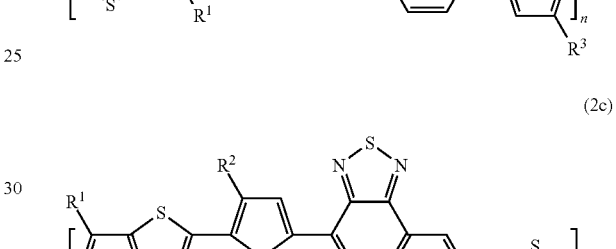
(2c)
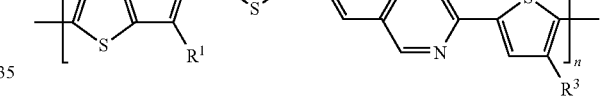
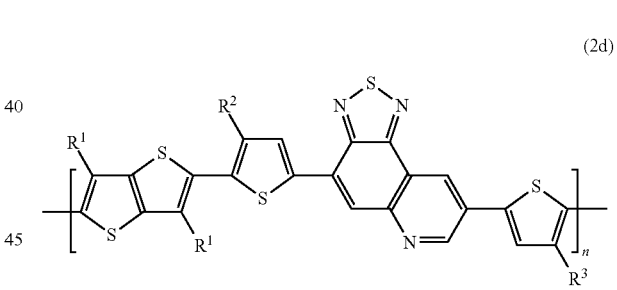
(2d)
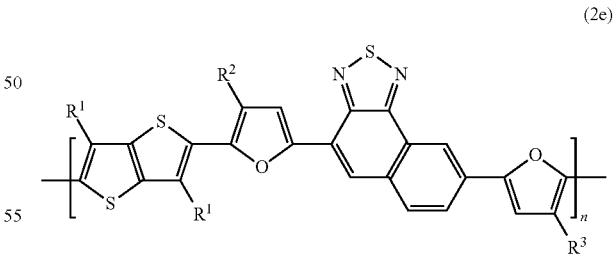
(2e)
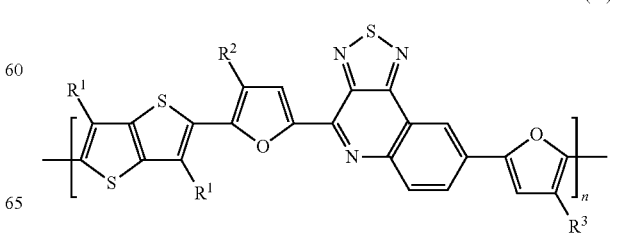
(2f)

-continued
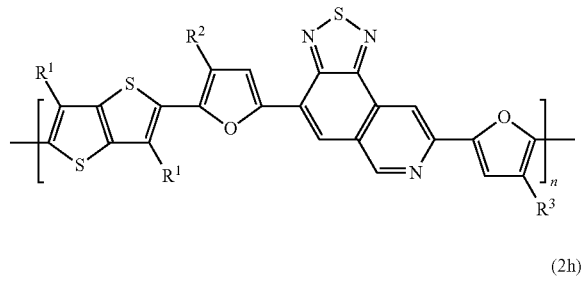
(2g)
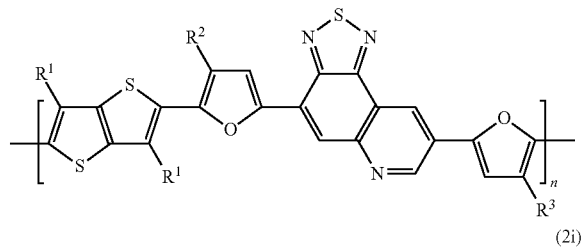
(2h)
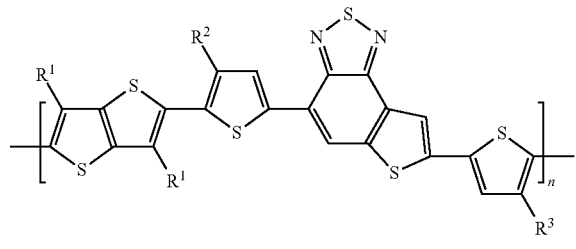
(2i)
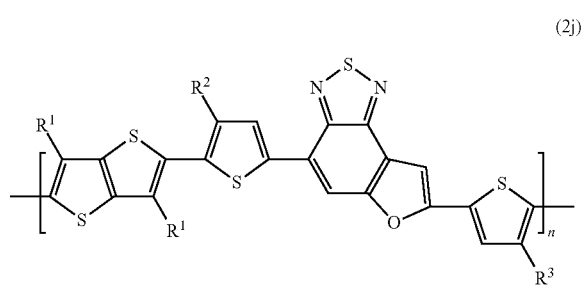
(2j)
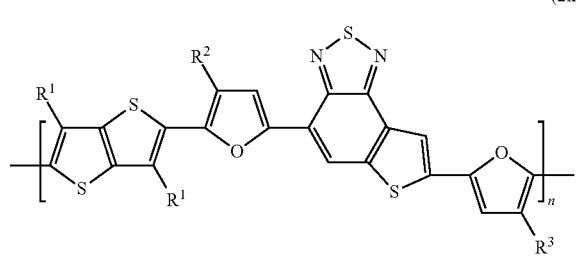
(2k)
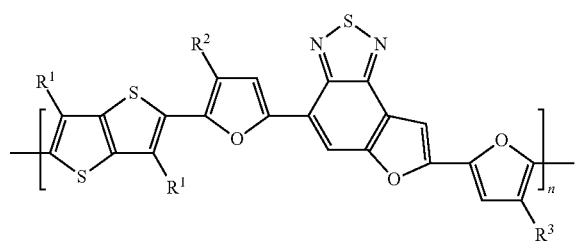
(2l)
The polymer of formula I may have the formula I-3:
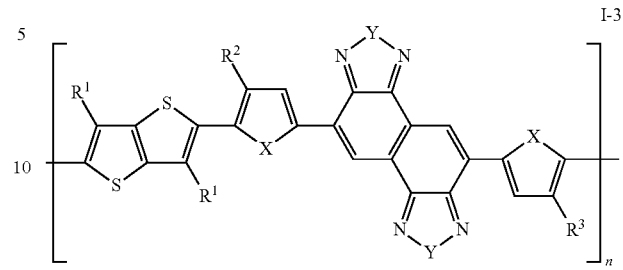
I-3
The polymer of formula I may have one of the following formulas:
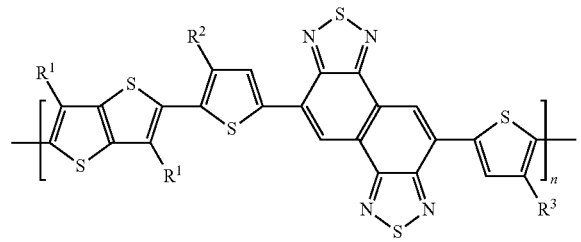
(3a)
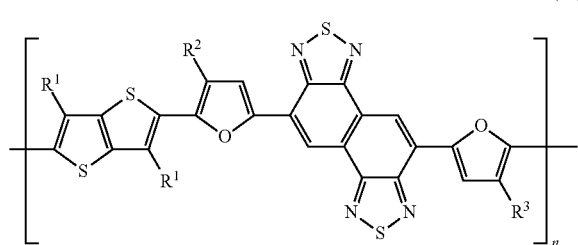
(3b)
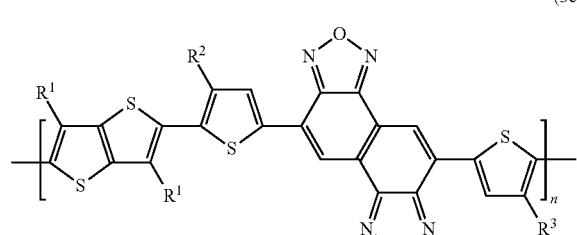
(3c)
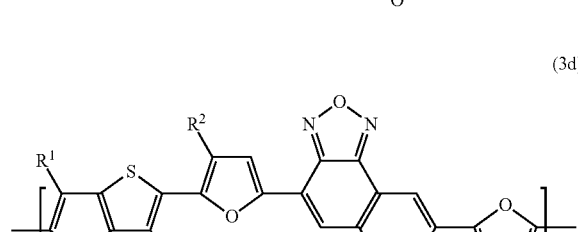
(3d)

The polymer of formula I may have the formula I-4:
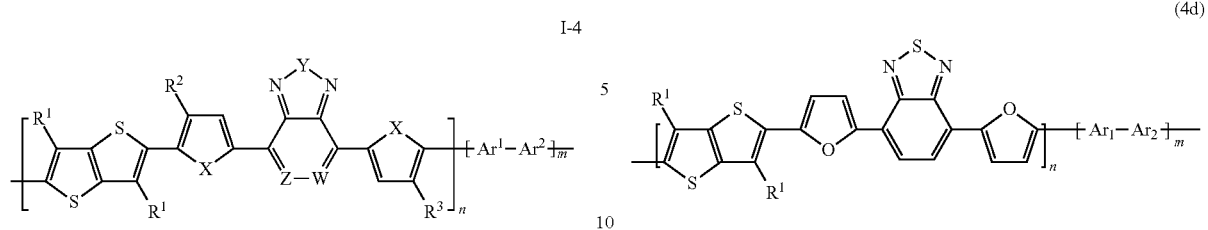
The polymer of formula I may have one of the following formulas:
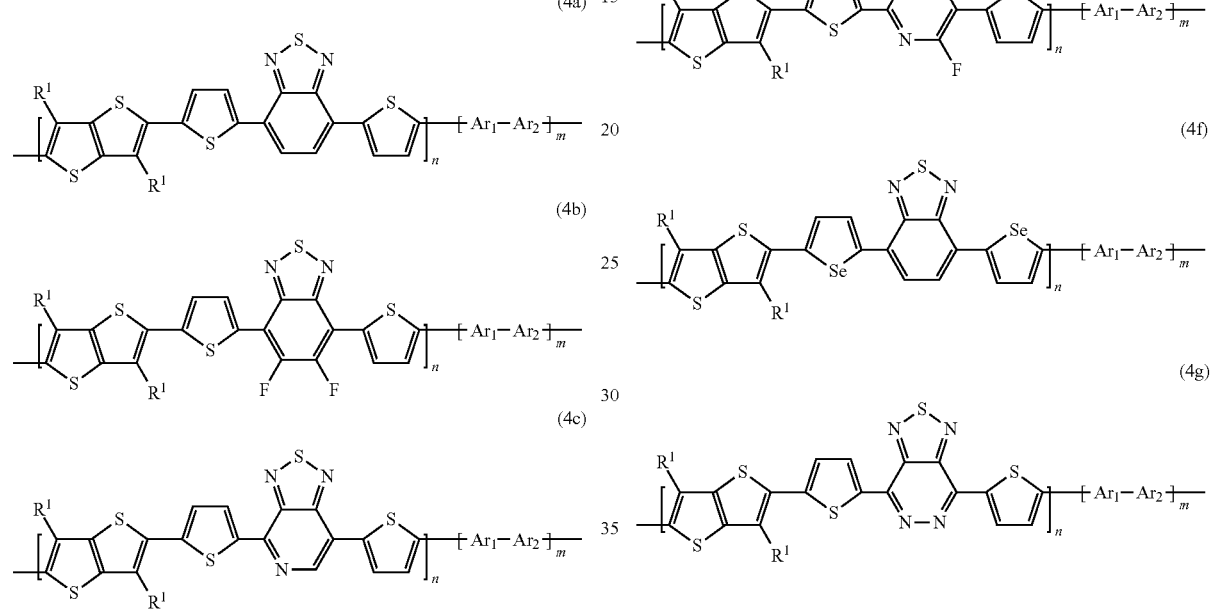
The polymer of formula I may have the formula I-5:
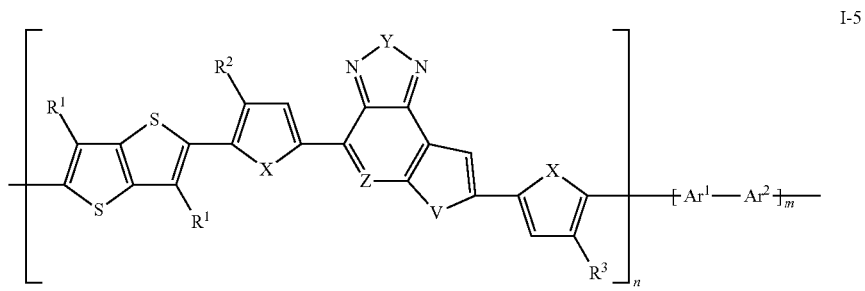
The polymer of formula I may have one of the following formulas:
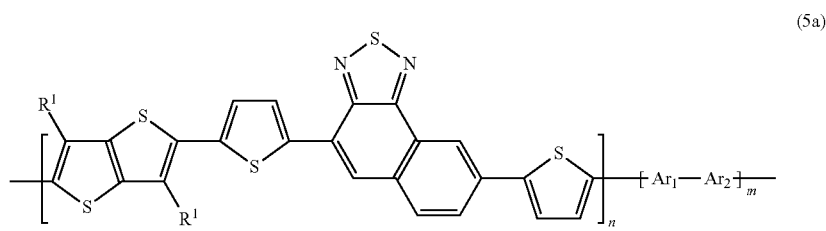

-continued
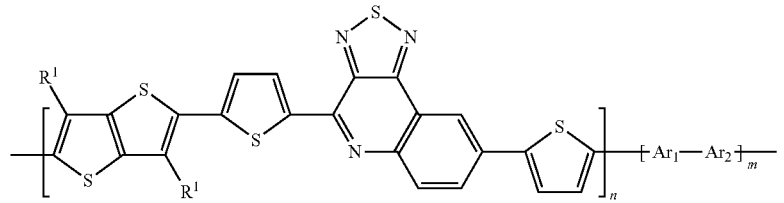
(5b)
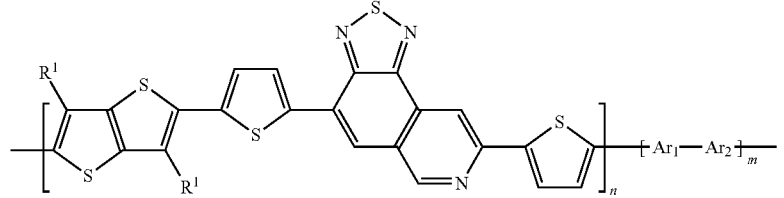
(5c)
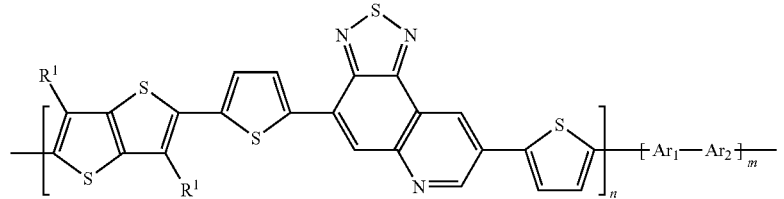
(5d)
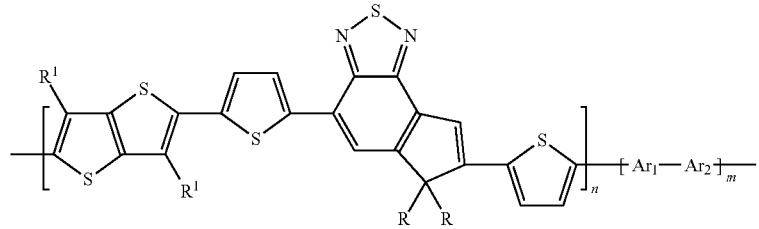
R: alkyl group, or R, R = O
(5e)
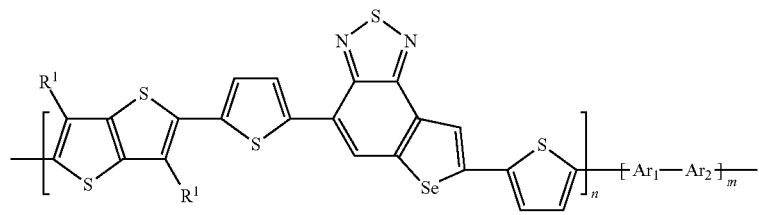
(5f)
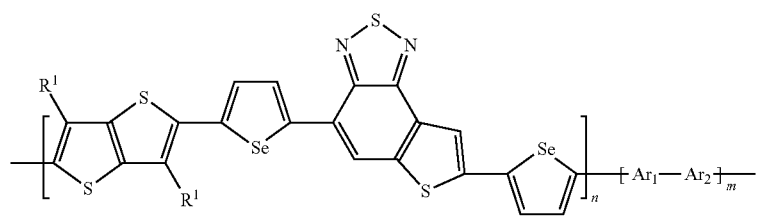
(5g)
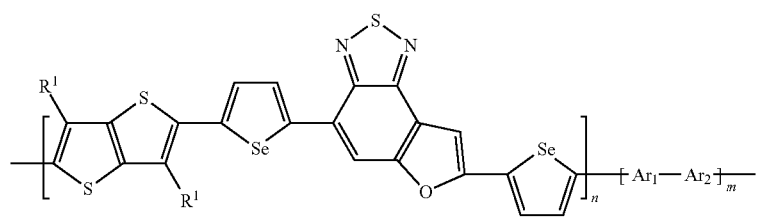
(5h)

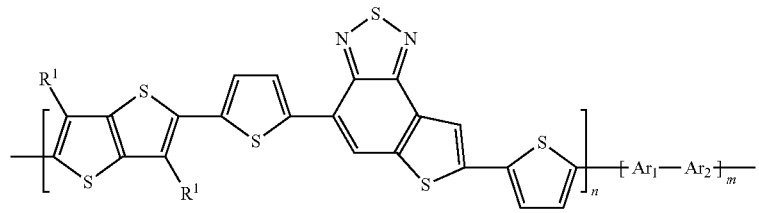
(5i)
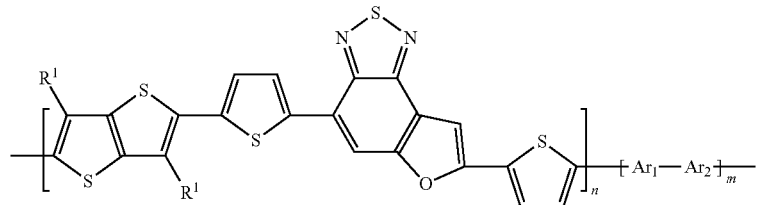
(5j)
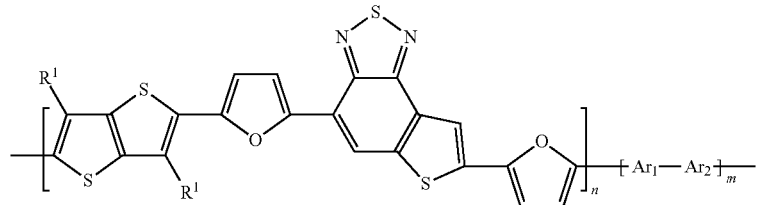
(5k)
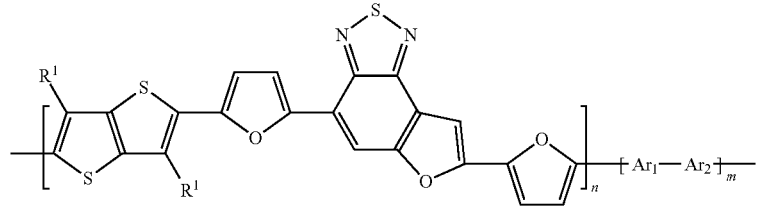
(5l)
The polymer of formula I may have the formula I-6:
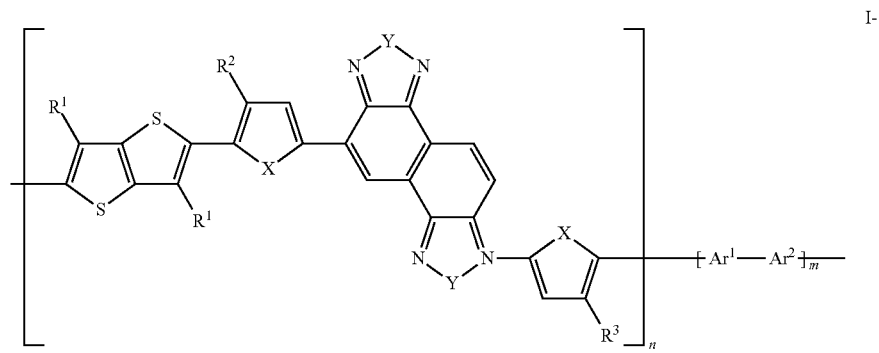
I-6
The polymer of formula I may have one of the following formulas:
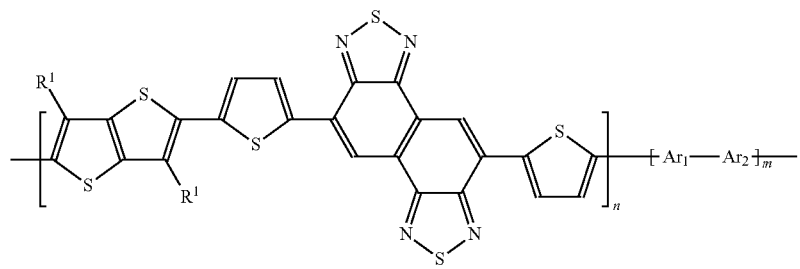
(6a)

-continued (6b)

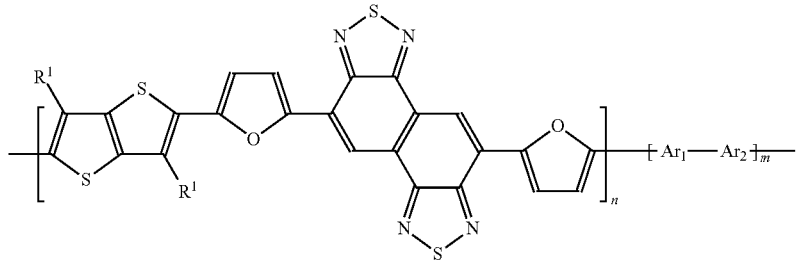

In each of formula I-1, 1a-1h, I-2, 2a-2l, I-3, 3a-3-d, I-4, 4a-4g, I-5, 5a-5l, I-6, 6a-6b, the definitions for $Ar^1$, $Ar^2$, $Ar^3$, V, X, Y, W, Z, R, $R^1$, $R^2$, $R^3$, $R^4$, $R^5$, $R^6$, $R^7$, $R^8$, $R^9$, $R^{10}$, $R^{11}$, $R^{12}$, n and m, where applicable, are as defined for formula I herein, unless otherwise specified.

The polymers of formula I thus incorporate building blocks that result in larger dihedral angles between some cyclic groups along the polymer backbone. As indicated above, the larger dihedral angles may result in shorter conjugation lengths. The shorter conjugation lengths may result in polymers having lower HOMO energy levels, and thus greater open circuit voltage values. As well, the larger dihedral angles along the polymer backbone may result in polymers having enhanced processability, due to reduced aggregation between polymer chains and thus increased solubility.

The polymers of formula I may thus have a bandgap value of about 1.4 eV to about 2.1 eV.

The polymers of formula I may thus be useful as a photoactive layer in organic electronic devices. As the polymers of formula I may exhibit increased solubility, it may be possible to process the polymers using halogen-free solvents.

The polymers of formula I can be synthesized using commercially available reagents and using routine chemical techniques, including via the Suzuki coupling reaction, the Stille coupling reaction, the Heck coupling reaction, the Wittig-Homer reaction, the Knoevenagel condensation reaction or the Songashira reaction, or via reduction polymerization, oxidation polymerization or condensation polymerization.

Particular reaction schemes to synthesize exemplified polymers of formula I are set out in the Examples below and in reaction Schemes 1-10 as included in FIGS. 1-10. The reagents and the reactions schemes may be adapted for synthesis of other compounds within formula I, using routine laboratory methods and techniques.

The polymers of formula I may be readily purified using an organic solvent and using standard purification techniques, including for example precipitation and/or Soxhlet extraction.

Thus, the polymers of formula I may be highly soluble in organic solvents, including halogenated solvents such as chloroform, chlorobenzene or dichlorobenzene, or any mixture thereof.

Due to the inclusion of the groups that result in some larger dihedral angles, the polymers may not be highly planar across the length of the polymer, and thus may also advantageously be soluble in other solvent systems that are not halogenated.

Thus, there is also provided a halogen-free solvent that may be useful for dissolving a compound of formula I, as well as a solution comprising a polymer of formula I dissolved in a halogen-free solvent. A halogen-free solvent is any material that solvates the polymer and that is not substituted with a halogen atom or any substituent containing a halogen atom.

The halogen-free solvent may be a single compound or may be a mixture of compounds, for example a mixture of non-aqueous organic compounds.

The halogen-free solvent may be selected based on the three parameter scale of the Hansen Solubility Parameters (HSP), which include dispersion, hydrogen bonding and polarity aspects. Commercial software is available to calculate the Hansen Solubility Parameters for any given solvent system (for example HSPiP software), including for solvents that are mixtures of compounds. For example, halogen-free solvents may be selected based on similar HSP values as compared to a known halogenated solvent in which the polymer is known to be soluble, for example dichlorobenzene.

The halogen-free solvent may have a dispersion parameter of about 18 to about 20. The halogen-free solvent may have a hydrogen bonding parameter of about 2 to about 4. The halogen-free solvent may have a polarity parameter of about 0.5 to about 6.5. In some embodiments, the halogen-free solvent may have a dispersion parameter of about 18 to about 20, a hydrogen bonding parameter of about 2 to about 4, and a polarity parameter of about 0.5 to about 6.5.

In some embodiments, the halogen-free solvent may comprise tetralin, indane or o-xylene. In some embodiments, the halogen-free solvent may comprise a mixture of tetralin: salicylaldehyde, a mixture of tetralin:methyl salicylate, a mixture of indane:salicylaldehyde or a mixture of o-xylene: salicylaldehyde, any of which may be mixed in a ratio of about 99.9:0.1 to about 90:10.

Solutions of a polymer of formula I, including a halogenated or halogen-free solvent in which the polymer is dissolved, can be used for solution processing of the polymer. For example, such solutions can be used as inks for printing layers comprising the polymer of formula I as an active layer in an organic electronic device. As well, such solutions may be used to form thin films comprising the polymer for inclusion in an organic electronic device. If the halogen-free solvent is used, there may be an added advantage of reduced or non-toxicity of the solvent, which may improve safety and environmental impact when fabricating the thin film.

Thus, there is provided a thin film comprising a polymer of formula I.

The thin film is a layer comprising a polymer of formula I as described herein, which may be formed to be in the order of from about 1 to about 1000 nm thick, from about 5 to about 500 nm thick, from about 10 to about 250 nm thick, or from about 10 to about 100 nm thick.

Thus, there is also provided a method of forming a thin film comprising a polymer of formula I.

To form the thin film, the polymer of formula I and any additional film components may be dissolved in a suitable organic solvent to form a solution comprising the polymer of formula I.

The solvent may be a halogen-free solvent as indicated above, and may comprise tetralin, indane or o-xylene, including any of the aforementioned in a mixture with salicylaldehyde or methyl salicylate, as described herein. Other suitable solvents include dichloromethane, chloroform, heptanes, octane, toluene, xylene, ethyl benzoate, methyl benzoate, 1,1,2,2-tetrachloroethane, THF, dioxane, chlorobenzene, dichlorobenzene, trichlorobenzene, mesitylene, and mixtures of the aforesaid solvents.

The solvent may also have dissolved therein any other components that are to be included in the thin film. For example, the thin film may contain a polymer of formula I as a p-type donor material, and may further contain an n-type acceptor material.

The solution is applied a substrate to form the thin film of the desired thickness.

The thin film may be formed on a suitable surface using any suitable deposition or coating methods including solution coating. Solution coating includes spin coating, casting, blade coating, bar coating, roll coating, wire bar coating, dip coating, spray coating, slot die coating, gravure printing including microgravure printing, screen printing, flexo printing, offset printing and inkjet printing.

The thin film may be formed on a suitable substrate, which may be any solid substrate, including for example, indium tin oxide (ITO) coated glass or plastic, fluorine tin oxide (FTO) coated glass or plastic, quartz, glass, mica, a plastic substrate such as polyethylene terephthalate (PET), polyethylene naphthalate (PEN), or polycarbonate, paper, metal, or silicon. The thin film may also be deposited onto another layer when forming a multilayered device, or onto an electrode.

There is therefore provided an organic electronic device comprising a active layer, the active layer comprising a polymer of formula I.

The organic electronic device may be any device that can generate a current flow. For example, the organic electronic device may be an organic photovoltaic cell including an organic photovoltaic cell having normal or inverted architecture, an organic thin film transistor, a photodiode, a light-emission diode, or a sensor including a chemical sensor, a biosensor or a biochemical sensor.

The polymers of formula I are suitable for use as donor p-type material in an active layer, and may be used in combination with an acceptor n-type material, for example [6,6]-phenyl-$C_{60}$-butyric acid methyl ester (PC61BM), [6,6]-phenyl-$C_{70}$-butyric acid methyl ester (PC71BM), 2-vinyl-4,5-dicyanoimidazoles, or a perylene tetracarboxylic diimide.

An additional polymeric electrolyte interlayer may be included between the active layer and one of the electrodes to enhance electron transfer efficiency. Examples of a suitable polymer electrolyte that may be used as a polymeric electrolyte interlayer adjacent to the cathode include any of the following:

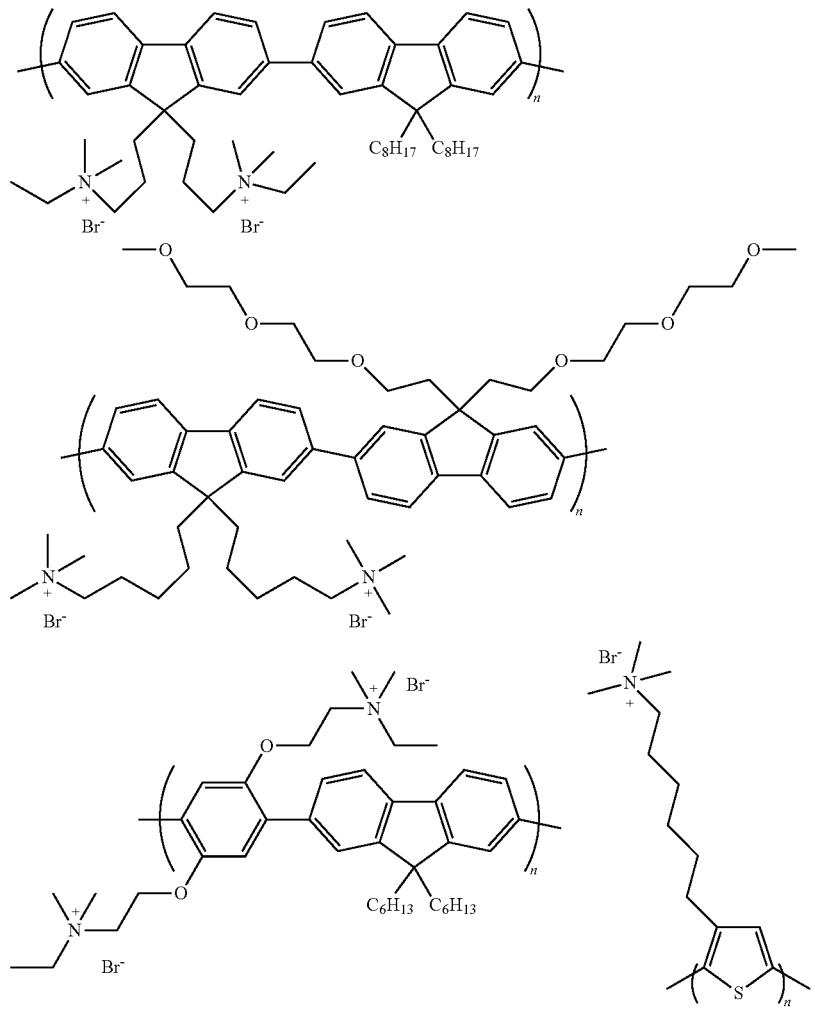

-continued

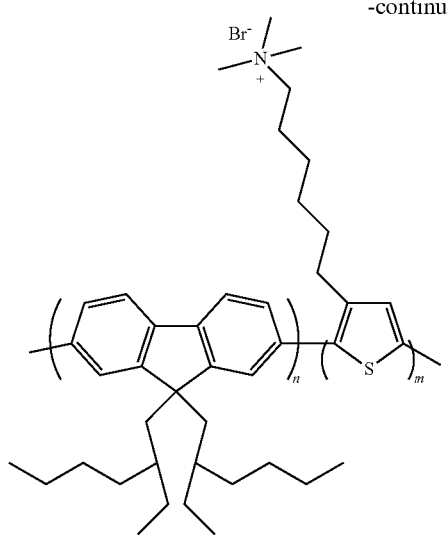

In the above polymer electrolyte formulas, each of m and n is independently an integer from 10 to 1000.

Figure 27:
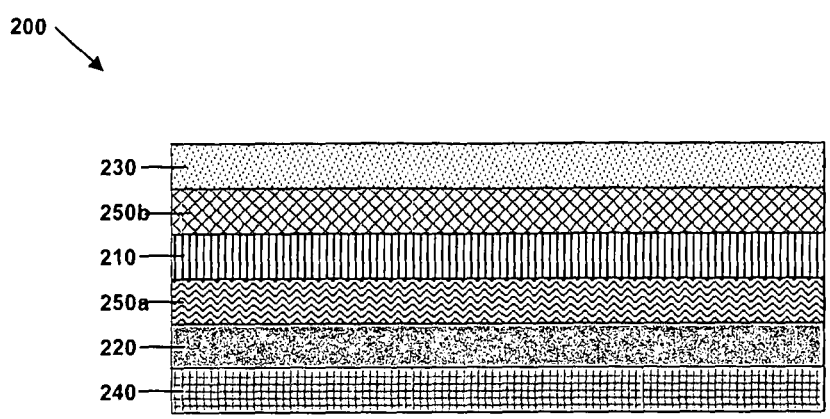
FIG. 27. Schematic representation of an example of an organic electronic device comprising a polymer of the invention in the photoactive layer.

For example, with reference to FIG. 27, device 200 comprises a photoactive layer 210 comprising a polymer of formula I as donor material. The photoactive layer 210 further includes acceptor material, as described above and in the Examples below.

Active layer 210 is deposited between cathode 230 and anode 220. In certain embodiments, photoactive layer 210 is from about 5 to about 100 nm thick.

The anode 220 is any material capable of conducting holes and injecting them into organic layers. Anode 220 may be gold, silver, fluorine tin oxide (FTO) or indium tin oxide (ITO), or conductive polymer layers. The anode 220 may be reflective, transparent, semi-transparent or translucent. In certain embodiments, the anode is transparent material such as ITO.

Cathode 230 is any material capable of conducting electrons and injecting them into organic layers. Cathode 230 may be a low work function metal or metal alloy, including, for example, barium, calcium, magnesium, indium, aluminum, ytterbium, silver, a calcium: silver alloy, an aluminum: lithium alloy, or a magnesium:silver alloy. The cathode 230 may be a single layer or have a compound structure. Cathode 230 may comprise layers of lithium fluoride, aluminium and silver. The cathode 230 may be reflective, transparent, semi-transparent or translucent.

In certain embodiments, one or more of the anode and the cathode may be deposited on a support 240, which may be transparent, semi-transparent or translucent. Support 240 may be rigid, for example quartz or glass, or may be a flexible polymeric substrate. Examples of flexible transparent semi-transparent or translucent substrates include, but are not limited to, polyimides, polytetrafluoroethylenes, polyethylene terephthalates, polyolefins such as polypropylene and polyethylene, polyamides, polyacrylonitrile and polyacrionitrile, polymethacrylonitrile, polystyrenes, polyvinyl chloride, and fluorinated polymers such as polytetrafluoroethylene.

The device may optionally comprise an additional layer 250 between the photoactive layer 210 and the anode 220 (250a), the cathode 230 (250b) or both. The layer 250a may be a poly(ethylene dioxytiophene)/polystyrene sulfonic acid (PEDOT:PSS) layer or Ca. The layer 250b may be a polyelectrolyte interlayer, as described above.

The above-mentioned devices may be prepared by layering the relevant layers on top of one another. The layers may be prepared by methods known in the art, including solution coating techniques mentioned above. Solution coating steps may be carried out in an inert atmosphere, such as, for example, under nitrogen gas. Alternatively, some layers may be prepared-by thermal evaporation or by vacuum deposition. Metallic layers may be prepared by known techniques, such as, for example, thermal or electron-beam evaporation, chemical-vapour deposition or sputtering, or printing conductive meal particle inks. Layers may be annealed at a temperature of from about 20° C. to about 250° C.

The above embodiment has been depicted as having an active layer comprising the acceptor material in the same layer as the p-type polymer of formula I. However, it will be appreciated that the present compounds can be used to form devices in which the p-type donor material is in a separate layer from the n-type acceptor material.

The above-mentioned devices may be prepared by laying the relevant layers on top of one another. The layers may be prepared by methods known in the art, including solution coating techniques mentioned above. Solution coating steps may be carried out in an inert atmosphere, such as, for example, under nitrogen gas. Alternatively, some layers may be prepared by thermal evaporation or by vacuum deposition. Metallic layers may be prepared by known techniques, such as, for example, thermal or electron-beam evaporation, chemical-vapour deposition or sputtering, or printing conductive metal particle inks.

The polymers, solvents, thin films, methods and devices as described herein are further exemplified by way of the following non-limiting examples.

EXAMPLES

Example 1

Synthesis of 3-Alk-1-Ynes

Generally, 3-alk-1-ynes were synthesized according to the reaction described in Scheme 1 (FIG. 1), and as follows.

3-Octyldodec-1-yne: 1-dodecyne (25.00 g, 0.15 mol) was added into a 500 mL Schlenk flask. The flask is then purged thrice with $N_2$. 100 mL of freshly prepared anhydrous THF was added into the flask under N2 protection. The solution was cooled and maintained at −20° C. for 30 min in an ice-acetone bath. n-BuLi (190 mL, 1.6 M, 0.305 mol) was added dropwise into the flask. The reaction mixture was kept stirring at −20° C. for 8 hrs, then left to react overnight with warming up to room temperature. The reaction solution was cooled down to −20° C. again. 1-Bromooctane (31.68 g, 0.15 mol) was added and the reaction stirred for one day with warming up to room temperature. 50 mL ice water was added into the flask to quench the reaction and the mixture was extracted with hexane (3×50 mL). The combined organic extracts were then washed with dilute hydrochloric acid (1 M). The solvent was evaporated off and the crude product was distillated in vacuum. The fractions from 120~140° C./5 mmHg (41.7 g, ~40%) were collected for the next step. 1H NMR (400 MHz, CD2Cl2) δ 2.31 (t, J=5.2 Hz, 1H), 2.06 (d, J=2.4 Hz, 1H), 1.49-1.27 (m, 30H), 0.88 (t, J=6.4 Hz, 6H).

3-Nonyltridec-1-yne: The same procedure as above was used. 1H NMR (400 MHz, $CD_2Cl_2$) δ 2.31 (t, J=5.2 Hz, 1H), 2.06 (d, J=2.4 Hz, 1H), 1.49-1.27 (m, 34H), 0.88 (t, J=6.4 Hz, 6H).

3-(2-Ethylhexyl)dec-1-yne: The same procedure as above was used. 1H NMR (400 MHz, $CD_2Cl_2$) δ 2.31 (t, J=5.2 Hz, 1H), 2.06 (d, J=2.4 Hz, 1H), 1.49-1.27 (m, 23H), 0.88 (t, J=6.4 Hz, 9H).

Example 2

Synthesis of 2,5-Dibromo-3,6-Bis(3-Octyldodecyl) Thieno[3,2-b]Thiophene 2,5-Dibromo-3,6-bis(3-octyldodecyl)thieno[3,2-b]thiophene was synthesized according to the reaction set out in Scheme 2 (FIG. 2), and as follows.

3,6-bis(3-octyldodec-1-yn-1-yl)thieno[3,2-b]thiophene: To a solution of 3,6-dibromo-thienothiophene (2.98 g, 0.01 mol) and 3-octyldodec-1-yne (6.96 g, 0.025 mol) in triethylamine (80 mL) were added dichlorobis(triphenylphosphine) palladium(II) (280 mg, 0.4 mmol) and copper(I) iodide (74 mg, 0.4 mmol). The reaction mixture was stirred at 80° C. overnight. Solvent removal by evaporation gave a residue that was purified by flash column chromatography using hexane as eluent. The crude product was collected as yellow liquid (6.9 g, 96% yield) for the next step. 1H NMR (400 MHz, $CD_2Cl_2$) δ 7.41 (s, 2H), 2.59 (m, 2H), 1.56-1.28 (m, 60H), 0.89 (t, J=6.4 Hz, 12H).

3,6-bis(3-octyldodecyl)thieno[3,2-b]thiophene: To a solution of 3,6-bis(3-octyldodec-1-yn-1-yl)thieno[3,2-b]thiophene (3.46 g, 5 mmol) in THF/EtOH (20 ml/40 ml) was added Pd(OH)$_2$/C (20 wt % dry basis on activated carbon) (1.4 g, 40% by weight) with a hydrogen balloon and the mixture stirred 12 hrs at 60° C. The reaction was monitored by 1HNMR, another batch of Pd(OH)$_2$/C (0.7 g, 20% by weight) was added to the mixture after 24 hours. The solution was filtered through Celite, the solvent was removed by evaporation and the residue was purified by chromatography using hexane as eluent to give product (3.3 g, 94% yield) as yellow oil. 1H NMR (400 MHz, CDCl$_3$, ppm): δ=6.96 (s, 2H), 2.68 (t, J=8.0 Hz, 4H), 1.69 (m, 4H), 1.49-1.19 (m, 62H), 0.88 (t, J=6.4 Hz, 12H).

2,5-dibromo-3,6-bis(3-octyldodecyl)thieno[3,2-b]thiophene: To a solution of 3,6-bis(3-octyldodecyl-thieno[3,2-b]thiophene (3.3 g, 4.7 mmol) in 40 mL chloroform was added dropwise the solution of NBS (1.76 g, 9.88 mmol) in 5 mL DMF and the mixture stirred overnight at room temperature. The solvent was evaporated off and the residue was purified by chromatography using hexane as eluent to give yellow oil. The oil was crystallized from hexane/ethanol mixture in the fridge to white solid (3.4 g, 85% yield). 1H NMR (400 MHz, $CD_2Cl_2$) δ 2.67 (t, J=8.0 Hz, 4H), 1.62 (m, 4H), 1.29 (m, 62H), 0.90 (t, J=6.4 Hz, 12H).

Example 3

Synthesis of 2,5-Dibromo-3,6-Bis(3-Nonyltridecyl) Thieno[3,2-b]Thiophene 2,5-Dibromo-3,6-bis(3-nonyltridecyl)thieno[3,2-b]thiophene was synthesized according to the reaction set out in Scheme 3 (FIG. 3), and as follows.

2,5-dibromo-3,6-bis(3-nonyltridecyl)thieno[3,2-b]thiophene: The same procedure as the preparation of 2,5-dibromo-3,6-bis(3-octyldodecyl)thieno[3,2-b]thiophene. White crystal was obtained with a yield of 86%. 1H NMR (400 MHz, $CD_2Cl_2$) δ 2.67 (t, J=8.0 Hz, 4H), 1.62 (m, 4H), 1.29 (m, 70H), 0.90 (t, J=6.4 Hz, 12H).

Example 4

Synthesis of 2,5-Dibromo-3,6-Bis(3-(2-Ethylhexyl) Decyl)Thieno[3,2-b]Thiophene 2,5-Dibromo-3,6-bis(3-(2-ethylhexyl)decyl)thieno[3,2-b]thiophene was synthesized according to the reaction set out in Scheme 4 (FIG. 4), and as follows.

2,5-dibromo-3,6-bis(3-(2-ethylhexyl)decyl)thieno[3,2-b]thiophene:

The same procedure as the preparation of 2,5-dibromo-3,6-bis(3-octyldodecyl)thieno[3,2-b]thiophene. Yellow oil was obtained with a yield of 90%. 1H NMR (400 MHz, $CD_2Cl_2$) δ 2.67 (t, J=8.0 Hz, 4H), 1.62 (m, 4H), 1.29 (m, 48H), 0.91 (t, J=6.4 Hz, 18H).

Example 5

Synthesis of 2,5-Bis(Trimethylstannyl)-3,6-Dioctylthieno[3,2-b]Thiophene 2,5-Bis(trimethylstannyl)-3,6-dioctylthieno[3,2-b]thiophene was synthesized according to the reaction set out in Scheme 5 (FIG. 5), and as follows.

2,5-dibromo-3,6-dioctylthieno[3,2-b]thiophene: The same procedure as the preparation of 2,5-dibromo-3,6-bis (3-octyldodecyl)thieno[3,2-b]thiophene. White crystals were obtained with a yield of 90%. 1H NMR (400 MHz, CD2Cl2) δ 2.67 (s, 4H), 1.66 (m, 4H), 1.31 (m, 20H), 0.88 (t, J=6.4 Hz, 6H).

2,5-bis(trimethylstannyl)-3,6-dioctylthieno[3,2-b]thiophene: 2,5-dibromo-3,6-dioctylthieno[3,2-b]thiophene (2.63 g, 5 mmol) was dissolved in anhydrous THF (60 mL) under nitrogen and cooled to −78° C., n-butyllithium (1.6 M, 6.5 mL) was added dropwise into the reaction. The solution was stirred for 2 hrs at -78° C., following which trimethyltin chloride (2.09 g, 10.5 mmol) was added. The reaction mixture was then allowed to warm to room temperature and stirred overnight. Water was added to quench the reaction, following which the THF was removed. Hexane was then added and the reaction mixture was washed 3 times with water. The solution was then dried with $MgSO_4$. Following filtration, the solvent was removed, and the compound was crystallized as white solid from methylene chloride/ethanol mixture (1.92 g, 73% yield). 1H NMR (400 MHz, CD$_2$Cl$_2$) δ 2.69 (t, J=8.0 Hz, 4H), 1.71 (m, 4H), 1.31 (m, 20H), 0.89 (t, J=6.4 Hz, 6H), 0.41 (s, 9H).

Example 6

Synthesis of 2,5-Bis(Trimethylstannyl)-3,6-Diethyl-thieno[3,2-b]Thiophene 2,5-Bis(trimethylstannyl)-3,6-diethylthieno[3,2-b]thiophene was synthesized according to the reaction set out in Scheme 6 (FIG. 6), and as follows:

2,5-bis(trimethylstannyl)-3,6-diethylthieno[3,2-b]thiophene: The same procedure as the preparation of 2,5-bis(trimethylstannyl)-3,6-dioctylthieno[3,2-b]thiophene. White crystals were obtained with a yield of 88%. 1H NMR (400 MHz, CD$_2$Cl$_2$) δ 2.69 (t, J=8.0 Hz, 4H), 0.89 (t, J=6.4 Hz, 6H), 0.41 (s, 9H).

Example 7

Synthesis of 4,7-Bis(5-Trimethylstannyl-4-Methyl-thien-2-Yl)-2,1,3-Benzothiadiazole 4,7-Bis(5-trimethylstannyl-4-methylthien-2-yl)-2,1,3-benzothiadiazole was synthesized according to the reaction set out in Scheme 7 (FIG. 7), and as follows.

4,7-bis(4-methylthien-2-yl)benzo-2,1,3-thiadiazole: A 20 mL microwave glass vial was charged with a stirrer bar, 4,7-dibromo-2,1,3-benzothiadiazole (0.6 g), 4-methylthiophene-2-boronic acid pinacol ester (1 g) and bis(triphenylphosphine)palladium(II) chloride (29 mg). 2M sodium carbonate (4 mL), 1,2-dimethoxyethane (10 mL), water (4.4 mL) and ethanol (2.4 mL) were then added and the vial was sealed. The vial was then heated at 120° C. for 2 min and then 160° C. for 20 min in a microwave reactor. After cooling, the contents of the vial were poured into water and extracted with dichloromethane. The title compound was obtained as orange solids (0.36 g, 53%) after flash column chromatography on silica, with 5% dichloromethane in hexane as the eluent. $^1$H NMR (CD$_2$Cl$_2$, 400 MHz) δ 7.99 (s, 2H), 7.87 (s, 2H), 7.08 (s, 2H), 2.38 (s, 3H).

4,7-Bis(5-trimethylstannyl-4-methylthien-2-yl)-2,1,3-benzothiadiazole: A mechanically stirred solution of 2,2,6,6-tetramethylpiperidine (0.81 mL, 4.80 mmol) in dry THF (40 mL) under argon was cooled to −78° C. and n-butyl-lithium (4.75 mmol) was added rapidly. The resulting solution was allowed to warm to room temperature. It was kept at room temperature for 10 min and subsequently cooled to −78° C. A solution of 4,7-bis(4-methylthien-2-yl)benzo-2,1,3-thiadiazole (0.6 g, 1.83 mmol) in dry THF was then added dropwise. The deep purple solution was stirred at −78° C. for 30 min, following which trimethyltin chloride (0.95 g, 4.75 mmol) was added. The reaction mixture was then allowed to warm to room temperature and stirred overnight. Water was added to quench the reaction, following which the THF was removed. Dichloromethane was then added and the reaction mixture was washed 3 times with water. The solution was then dried with MgSO$_4$. Following filtration, the solvent was removed, and the title compound was obtained as orange needles (0.435 g, 36.5%) after recrystallisation in ethanol. $^1$H NMR (CD$_2$Cl$_2$, 400 MHz) δ 8.06 (s, 2H), 7.85 (s, 2H), 2.42 (s, 3H), 0.46 (s, 18H).

Example 8

Synthesis of 4,7-Bis(5-Trimethylstannyl-3-Methyl-thien-2-Yl)-2,1,3-Benzothiadiazole 4,7-Bis(5-trimethylstannyl-3-methylthien-2-yl)-2,1,3-benzothiadiazole was synthesized according to the reaction set out in Scheme 8 (FIG. 8), and as follows.

4,7-Bis(5-trimethylstannyl-3-methylthien-2-yl)-2,1,3-benzothiadiazole: This compound was synthesized using the same procedure as 4,7-Bis(5-trimethylstannyl-4-methylthien-2-yl)-2,1,3-benzothiadiazole, using 3-methylthiophene-2-boronic acid pinacol ester instead of 4-methylthiophene-2-boronic acid pinacol ester. Yellow crystals were obtained with a yield of 58%. $^1$H NMR (CD$_2$Cl$_2$, 400 MHz) δ 7.66 (s, 2H), 7.14 (s, 2H), 2.35 (s, 3H), 0.43 (s, 18H).

Example 9

Synthesis of 4,7-Bis(5-Trimethylstannyl-4-Hexylth-ien-2-yl)Benzo-2,1,3-Thiadiazole 4,7-Bis(5-trimethylstannyl-4-hexylthien-2-yl)benzo-2,1,3-thiadiazole was synthesized according to the reaction set out in Scheme 9 (FIG. 9), and as follows.

4,7-Bis(5-trimethylstannyl-4-hexylthien-2-yl)benzo-2,1,3-thiadiazole: This compound was synthesized using the same procedure as 4,7-Bis(5-trimethylstannyl-4-methylthien-2-yl)-2,1,3-benzothiadiazole, using 4-hexylthiophene-2-boronic acid pinacol ester instead of 4-methylthiophene-2-boronic acid pinacol ester. Yellow crystals were obtained with a yield of 65%. $^1$H NMR (CD$_2$Cl$_2$, 400 MHz) δ 8.10 (s, 2H), 7.86 (s, 2H), 2.69 (t, 4H), 1.70-1.67 (m, 4H), 1.43-1.36 (m, 12H), 0.92 (t, 6H), 0.45 (s, 18H).

Example 10

Synthesis of Polymers 1-3

Figure 10:
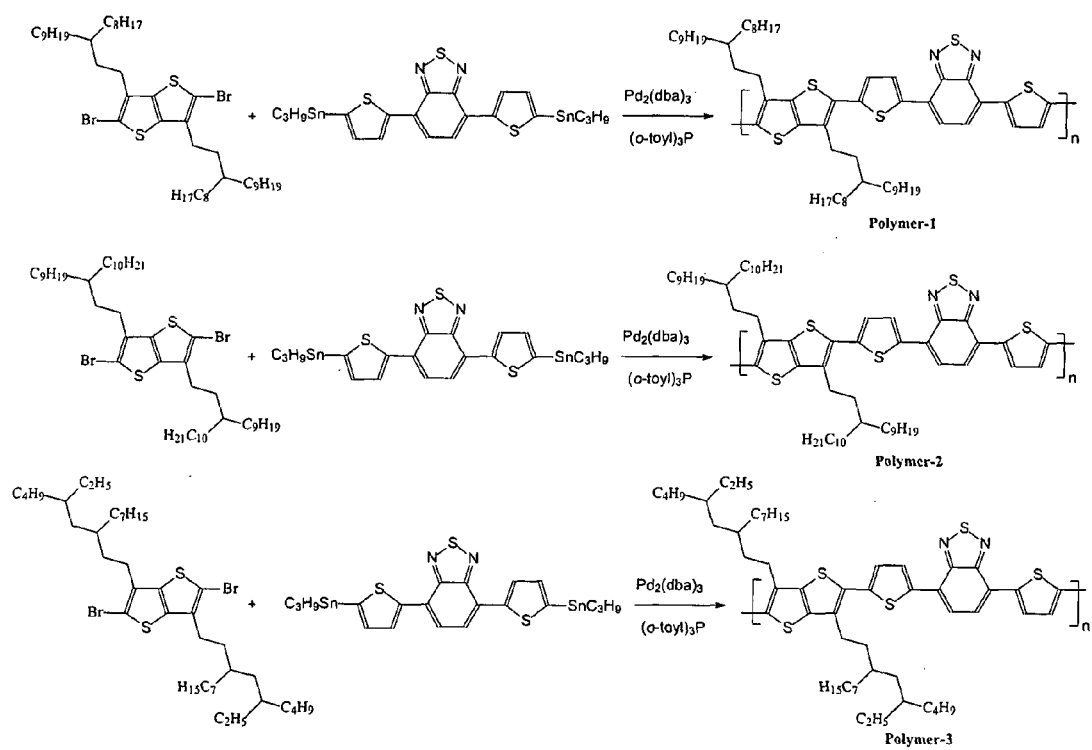
FIG. 10. Reaction scheme for synthesis of polymers 1-3.
Figure 11:
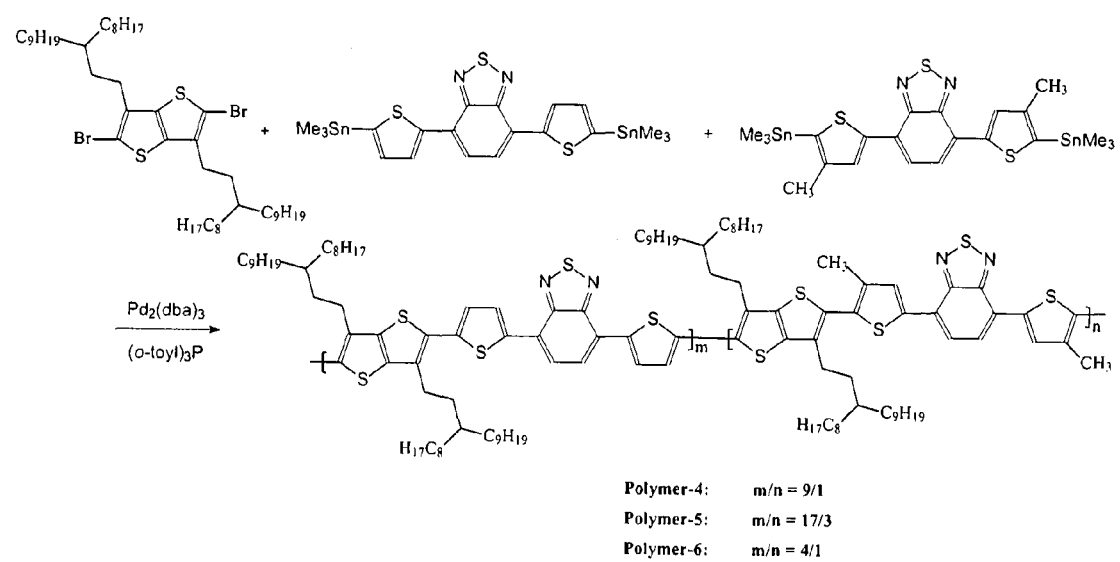
FIG. 11. Reaction scheme for synthesis of polymers 4-6.
Figure 12:
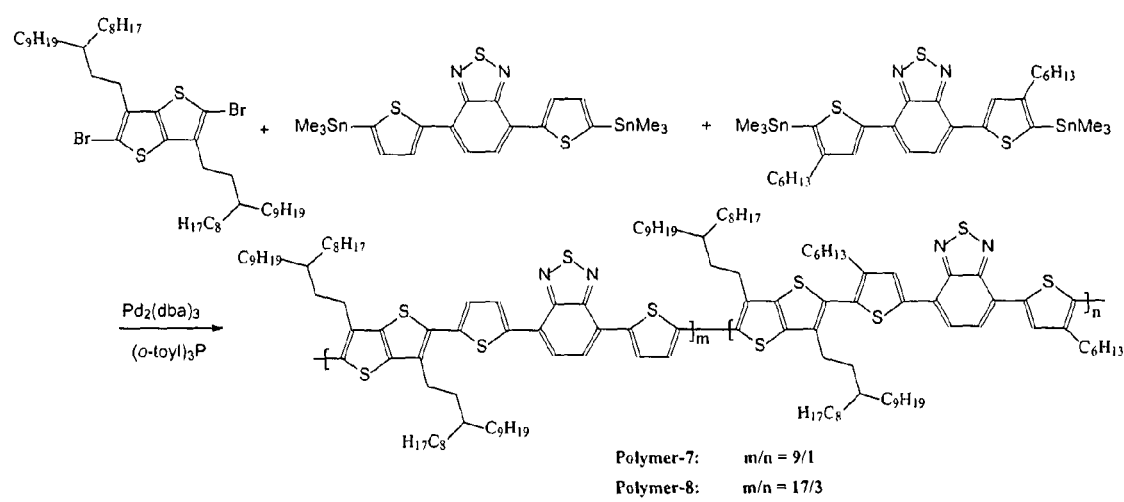
FIG. 12. Reaction scheme for synthesis of polymers 7 and 8.
Figure 13:
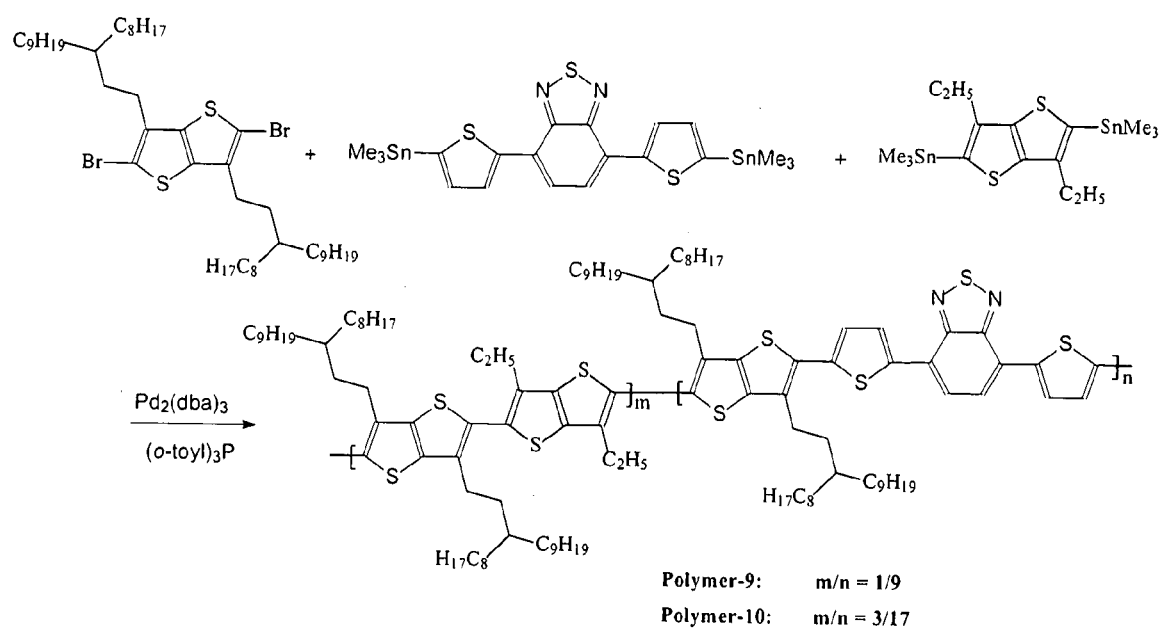
FIG. 13. Reaction scheme for synthesis of polymers 9 and 10.
Figure 14:
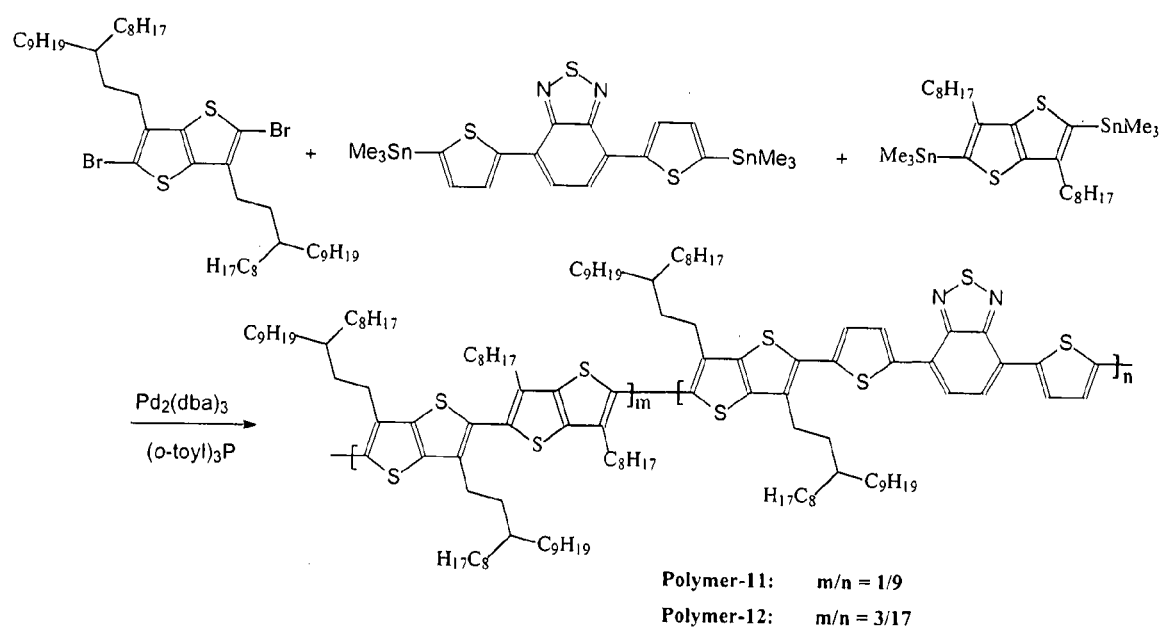
FIG. 14. Reaction scheme for synthesis of polymers 11 and 12.
Figure 15:
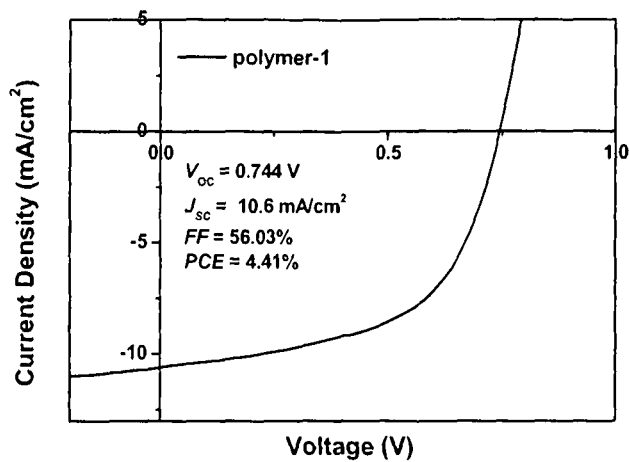
FIGS. 15-26. Graphs depicting current density as a function of voltage for OPV devices comprising each of polymers 1-12.
Figure 16:
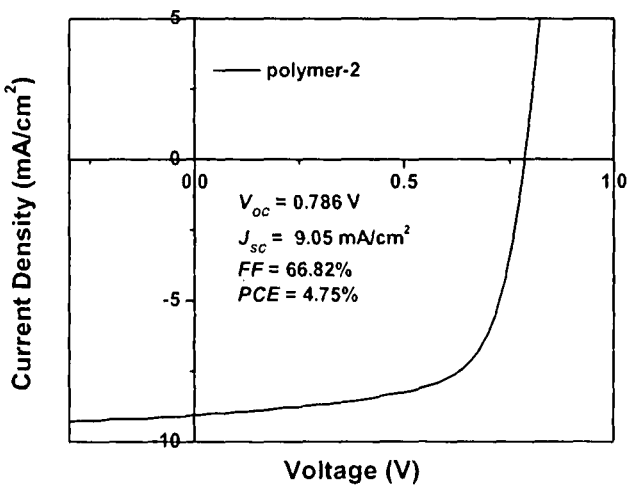
Figure 17:
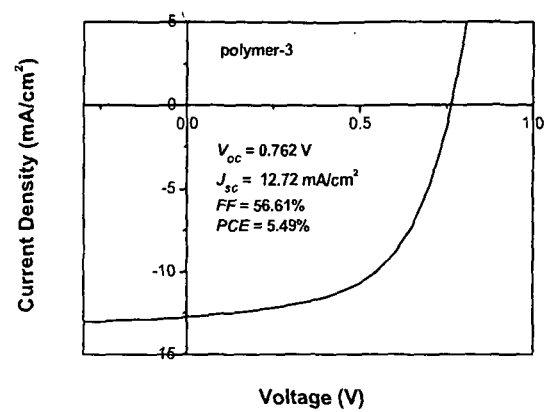
Figure 18:
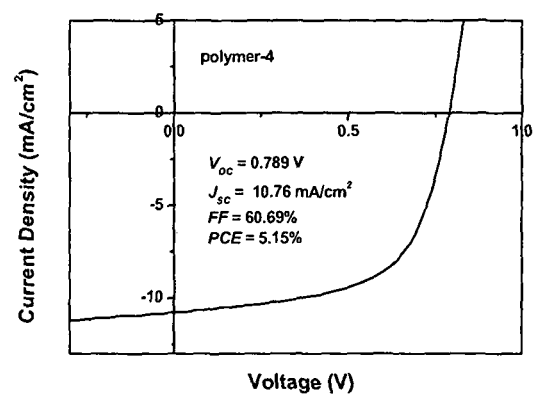
Figure 19:
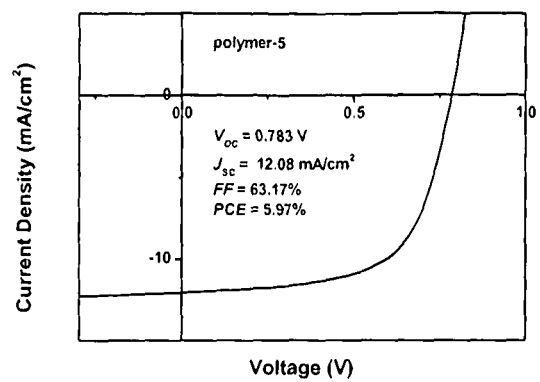
Figure 20:
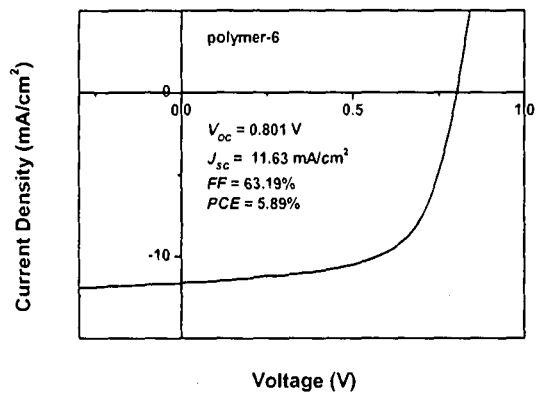
Figure 21:
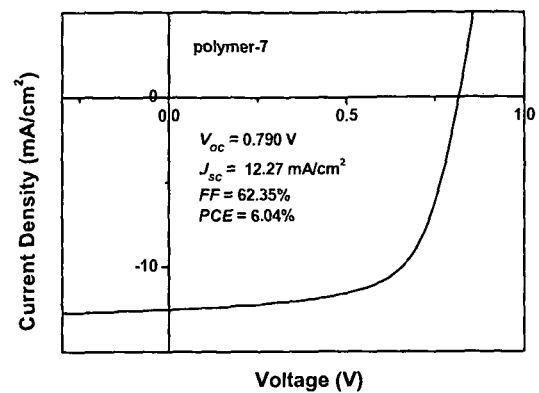
Figure 22:
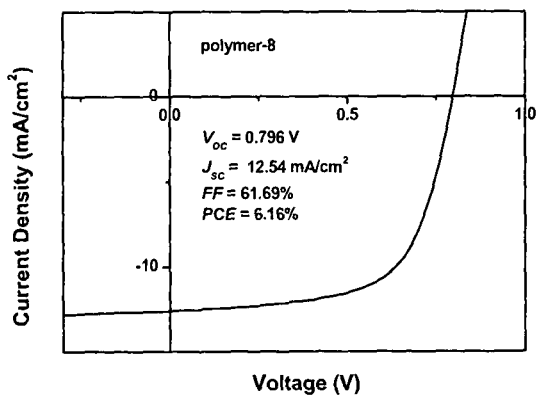
Figure 23:
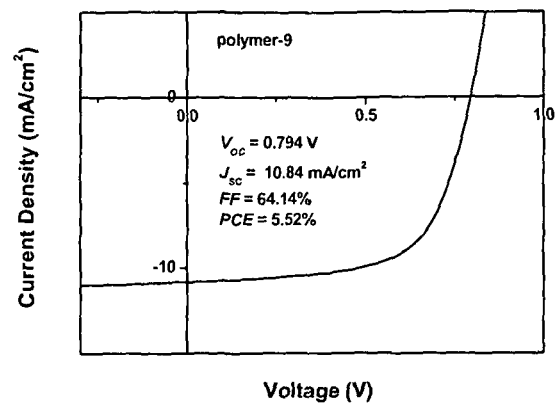
Figure 24:
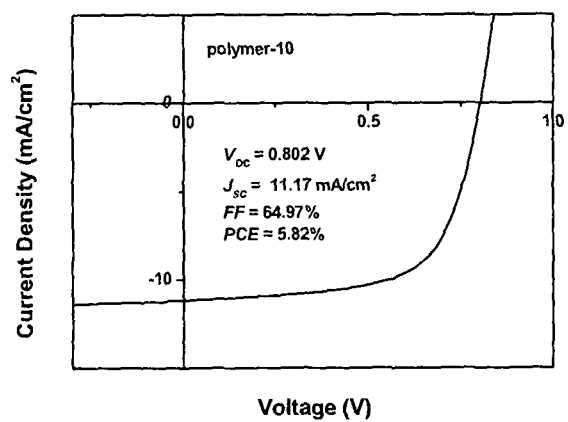
Figure 25:
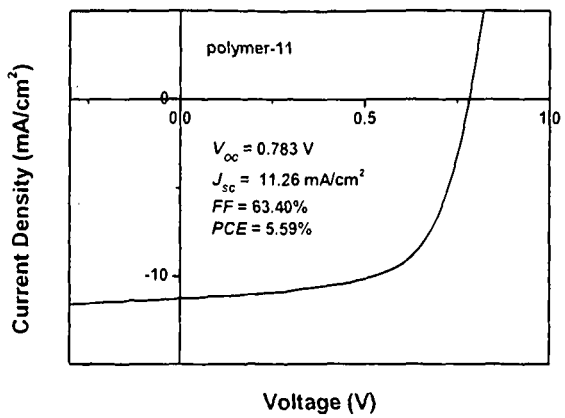
Figure 26:
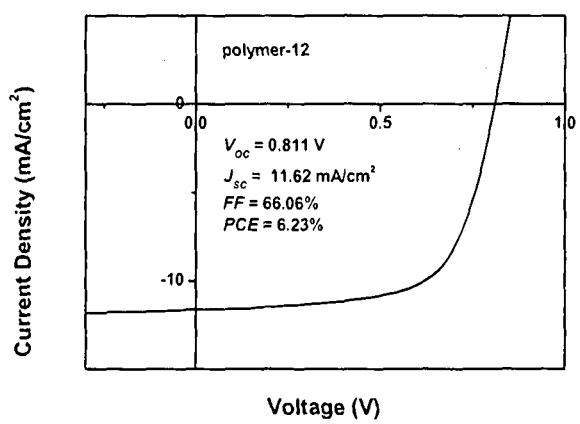

General Synthetic Procedure for Polymers 1-3: reactions are set out in Scheme 10 (FIG. 10).

The monomers (0.3 mmol) were weighed and added to a Schlenk flask equipped with a magnetic stirrer. The flask was then transferred to a glovebox where tris(dibenzylideneacetone)dipalladium(0) (2 mol % equivalent), tri(o-tolyl)phosphine (8 mol % equivalent) and anhydrous chlorobenzene (20 mL) were added. The reaction was then stirred at 120° C. in oil bath for 36 hrs. The reaction mixture was poured into 200 mL of methanol and 15 mL of concentrated hydrochloric acid and stirred overnight to remove the stannylated end-groups. The subsequent purification processes depended on the solubility of the polymer. The polymers were subjected to soxhlet extraction with ethanol and hexanes for 24 h each to remove the oligomers, then soxhlet extraction with chloroform and/or chlorobenzene. The fractions in chloroform and/or chlorobenzene were concentrated and precipitated into methanol, filtered to obtain the final product.

Polymer 1: The polymer is soluble in hot chlorobenzene (98% yield). $^1$H NMR (Cl$_2$CDCDCl$_2$, 400 MHz) δ 8.23 (2H), 7.96 (2H), 7.38 (2H), 3.09 (4H), 1.90 (4H), 1.59-1.33 (62H), 0.95 (12H).

Polymer 2: The polymer can be obtained from chloroform fraction (68% yield) and chlorobenzene fraction (30% yield). $^1$H NMR (Cl$_2$CDCDCl$_2$, 400 MHz) δ 8.23 (2H), 7.96 (2H), 7.38 (2H), 3.09 (4H), 1.90 (4H), 1.59-1.33 (70H), 0.95 (12H).

Polymer 3: The polymer is soluble in chloroform (95% yield). $^1$H NMR (Cl$_2$CDCDCl$_2$, 400 MHz) δ 8.23 (2H), 7.96 (2H), 7.38 (2H), 3.10 (4H), 1.91 (4H), 1.66 (2H), 1.48-1.36 (46H), 0.95 (18H).

Example 11

Synthesis of Polymers 4-12

General Synthetic Procedure for Polymers 4-12: Specific reactions are set out in Schemes 11-14 (FIGS. 11-14).

2,5-dibromo-3,6-bis(3-octyldodecyl)thieno[3,2-b]thiophene (0.1 mmol), 4,7-Bis(5-trimethylstannyl-thien-2-yl)-2,1,3-benzothiadiazole and defect monomers with different feeding ratios, were weighed and added to a Schlenk flask equipped with a magnetic stirrer. The flask was then transferred to a glovebox where tris(dibenzylideneacetone)dipalladium(0) (2 mol % equivalent), tri(o-tolyl)phosphine (8 mol % equivalent) and anhydrous chlorobenzene (7 mL) were added. The reaction was then stirred at 120° C. in oil bath for 36 hrs. The reaction mixture was poured into 100 mL of methanol and 10 mL of concentrated hydrochloric acid and stirred overnight to remove the stannylated end-groups.

The polymers were collected and dissolved in chloroform. The chloroform solution was precipitated into ethyl acetate to obtain the final product. All the polymers were obtained with yields of 90-98%.

Example 12

Organic Photovoltaic Device Fabrication

Both polymer and PC71BM were dissolved separately in anhydrous 1,2-dichlorobenzene (DCB). The polymer solution was heated on a magnetic hotplate stirrer at 70° C. for 2 hours; while the PCBM solution was stirred at 45° C. for 2 hours. The 2 solutions were then mixed together and the solution blend was stirred at 45° C. for at least 2 hours. The final polymer concentration of the blend is 10 mg/ml. Blends of the polymer with PC71BM were prepared in the mass ratios of 1:1.

Devices were prepared on indium tin oxide (ITO) patterned glass substrate. The ITO patterned glass substrates were first sonicated in a detergent (Hellmanex) bath for 30 minutes, followed by 2 rounds of sonication in de-ionized water for 10 minutes. This was succeeded by sonicating in acetone and then iso-propanol bath for 15 min and 20 minutes respectively. The cleaning step was concluded by blow-drying the substrates using nitrogen-gun. The substrates were then placed in an oven at 80° C. for at least an hour.

The substrates were subjected to an UV ozone treatment for 10 minutes before a PEDOT:PSS (CLEVIOS™ P VP Al 4083) layer of 30-35 nm thickness was spin-coated onto the ITO surface. The PEDOT:PSS-coated substrates were then annealed at 120° C. for 10 minutes. Next, the polymer solution was heated at 100° C. for 10 minutes before being spin-coated on the substrates in an inert glove-box (N$_2$ atmosphere) and allowed to dry slowly for 2 hours. Lastly, 100 nm of aluminum were deposited via an evaporation system as the cathode. The active area of the device was 9 mm$^2$.

The devices were tested and the performance, oxidation potential and HOMO energy level for each device is set out in Table 1. Measurement of current density as a function of voltage is shown in FIGS. 15-26.

TABLE 1

Polymer OPV Performance, Oxidation Potentials and HOMO Energy Levels

| Polymer | $E_{ox}$ (V) | HOMO (eV) | $V_{OC}$ (V) | $J_{SC}$ (mA/cm$^2$) | FF (%) | PCE (%) |
|---|---|---|---|---|---|---|
| Polymer-1 | 0.42 | 5.22 | 0.744 | 10.60 | 56.03 | 4.41 |
| Polymer-2 | 0.42 | 5.22 | 0.786 | 9.05 | 66.82 | 4.75 |
| Polymer-3 | 0.42 | 5.22 | 0.762 | 12.72 | 56.61 | 5.49 |
| Polymer-4 | 0.46 | 5.26 | 0.789 | 10.76 | 60.69 | 5.15 |
| Polymer-5 | 0.43 | 5.23 | 0.783 | 12.08 | 63.17 | 5.97 |
| Polymer-6 | 0.49 | 5.29 | 0.801 | 11.63 | 63.19 | 5.89 |
| Polymer-7 | 0.40 | 5.20 | 0.790 | 12.27 | 62.35 | 6.04 |
| Polymer-8 | 0.44 | 5.24 | 0.796 | 12.54 | 61.69 | 6.16 |
| Polymer-9 | 0.43 | 5.23 | 0.794 | 10.84 | 64.14 | 5.52 |
| Polymer-10 | 0.44 | 5.24 | 0.802 | 11.17 | 64.97 | 5.82 |
| Polymer-11 | 0.41 | 5.21 | 0.783 | 11.26 | 63.40 | 5.59 |
| Polymer-12 | 0.46 | 5.26 | 0.811 | 11.62 | 66.06 | 6.23 |

Example 13

Synthesis of Polymeric Ink and Formation of Thin Film

Polymer 5: An active layer ink was made in an inert atmosphere by dissolving 10 mg of Polymer 5 and 10 mg of PC71BM in 1 ml of dichlorbenzene. The ink was heated to allow the materials to dissolve completely before the active layer deposition. The ink was deposited on a ITO-glass substrate coated with PEDOT:PSS by spincoating at 500 rpm for 130 s to form the active layer film. The film was dried at room temperature.

0.5 mg of the polyelectrolyte poly[(9,9-bis(3'-((N,N-dimethyl)-N-ethylammonium)-propyl)-2,7-fluorene)-alt-2,7-(9,9-dioctylfluorene)]dibromide was dissolved in a solvent system that includes 1 ml of methanol and 50 μL of acetic acid in at room temperature. The polyelectrolyte layer was deposited on the active layer film by spincoating at 3000 rpm for 60 s to form a thin film of 5-10 nm. The substrate with the active layer and polyelectrolyte layer was placed in an MBraun vacuum chamber for cathode deposition. 100 nm of aluminum was deposited. The efficiency of a typical photovoltaic device formed as described was about 7.39%, with a Voc of 0.76 V, Jsc of 13.71 mA/cm2 and fill factor (FF) of 0.71 without any thermal annealing.

Example 14

Synthesis of Polymeric Ink and Formation of Thin Film

Polymer 7: An active layer ink was made in an inert atmosphere by dissolving 10 mg of Polymer 7 and 10 mg of PC71BM in 1 ml of dichlorbenzene. The ink was heated to allow the materials to dissolve completely before the active layer deposition. The ink was deposited on a ITO-glass substrate coated with PEDOT:PSS by spincoating at 500 rpm for 130 s to form the active layer film. The film was dried at room temperature.

0.5 mg of the polyelectrolyte poly[(9,9-bis(3'-(N,N-dimethyl)-N-ethylammonium)-propyl)-2,7-fluorene)-alt-2,7-(9,9-dioctylfluorene)]dibromide was dissolved in a solvent system that includes 1 ml of methanol and 50 µL of acetic acid in at room temperature. The polyelectrolyte layer was deposited on the active layer film by spincoating at 3000 rpm for 60 s to form a thin film of 5-10 nm. The substrate with the active layer and polyelectrolyte layer was placed in an MBraun vacuum chamber for cathode deposition. 100 nm of aluminum was deposited. The efficiency of a typical photovoltaic device formed as described was about 6.11%, with a Voc of 0.75 V, Jsc of 11.98 mA/cm2 and fill factor (FF) of 0.68 without any thermal annealing.

Example 15

Development of Halogen-Free Solvent Systems

The selection of solvent was based on three-parameter scale is the Hansen Solubility Parameters (HSP), which include dispersion, hydrogen-bonding, and polarity aspects that create a more complicated three-dimensional space. HSP were chosen (over other parameters) to determine the solubility of polymer in solvents due to the convenience of HSPiP software, which calculated the numerical values for most chemicals and mixture of chemicals.

Optimisation in the HSPiP software was based on simulation of dichlorobenzene properties, which is a good solvent for photoactive low bandgap polymer. Model solvent systems were selected based on the simulation. It was found that, for a solvent to be able to dissolve the polymer well, dispersion parameter (δd) of the solvent had to be high, approximately 18.0-20.0, while hydrogen bonding parameter (δh) had to be low, approximately 2.0-4.0. Polarity parameter (δp) was found to be most versatile, tolerating values ranging from 0.5 to 6.5. Table 1 sets out a series of the halogen-free solvent systems and the Hansen Solubility Parameters for those systems.

TABLE 2

Hansen Solubility Parameters for Halogen-Free Solvents

| | Chemicals | Range of ratio by volume | Hansen Solubility Parameters (HSP) | | |
|---|---|---|---|---|---|
| | | | $\delta_D$ | $\delta_P$ | $\delta_H$ |
| 1 | tetralin/salicylaldehyde | 99.9:0.1-90:10 | 19.6 | 2.3 | 3.2 |
| 2 | tetralin/methyl salicylate | 99.9:0.1-90:10 | 19.6 | 2.2 | 3.2 |
| 3 | Indane/salicylaldehyde | 99.9:0.1-90:10 | 19.5 | 3.7 | 2.7 |
| 4 | o-xylene/salicylaldehdye | 99.9:0.1-90:10 | 17.9 | 1.6 | 3.6 |

Example 16

Halogen-Free Solvent System for OPV Device Fabrication

An ITO-coated substrate was treated under UV-ozone for 10 minutes. A hole-transporting material (PEDOT:PSS) was filtered and spincoated on the substrate. This process was done in the cleanroom and not in an inert atmosphere. The step process used was 500 rpm for 5 seconds at first, followed by 4000 rpm for 60 s.

The substrate was then annealed for 10 minutes at 120° C. in inert environment. An active layer solution was made in an inert atmosphere. 10 mg of polymer 5 and 10 mg of PC71BM were dissolved in 1 ml of the solvent system (97% of tetralin and 3% of salicylaldehyde). The solution was heated at 45 to 70° C. and stirred to dissolve overnight.

Upon complete dissolution, the solution was put at 100° C. before spincoating. The ink was filtered and deposited on top of PEDOT:PSS layer by spincoating in a single step process (500 rpm/120 s) Subsequently, it was placed in a vacuum evaporator for cathode (aluminum) deposition. After 100 nm of aluminum was deposited, the completed device was tested. The device was tested again after annealing at 90-100° C. The efficiency of a typical photovoltaic device formed as described was about 6.21%, with a Voc of 0.815 V, Jsc of 12.42 mA/cm2 and fill factor (FF) of 0.613.

All publications and patent applications cited in this specification are herein incorporated by reference as if each individual publication or patent application were specifically and individually indicated to be incorporated by reference. The citation of any publication is for its disclosure prior to the filing date and should not be construed as an admission that the present invention is not entitled to antedate such publication by virtue of prior invention.

As used in this specification and the appended claims, the singular forms "a", "an" and "the" include plural reference unless the context clearly dictates otherwise. As used in this specification and the appended claims, the terms "comprise", "comprising", "comprises" and other forms of these terms are intended in the non-limiting inclusive sense, that is, to include particular recited elements or components without excluding any other element or component. As used in this specification and the appended claims, all ranges or lists as given are intended to convey any intermediate value or range or any sublist contained therein. Unless defined otherwise all technical and scientific terms used herein have the same meaning as commonly understood to one of ordinary skill in the art to which this invention belongs.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

REFERENCES

McCulloch et al., Liquid-crystalline semiconducting polymers with high charge-carrier mobility, Nature Mater. 2006, 5, 328-333.

McCulloch et al., Nature Mater. 2006, 5, 328-333.

Y. Li et al., Poly(2,5-bis(2-thienyl)-3,6-dialkylthieno[3,2-b]thiophene)s-High-Mobility Semiconductors for Thin-Film Transistors, Adv. Mater. 2006, 18, 3029-3032.

Y. Li et al., A High Mobility P-Type DPP-Thieno[3,2-b]thiophene Copolymer for Organic Thin-Film Transistors, Adv. Mater. 2010, 22, 4862-4866.

Joong Suk Lee et al., Importance of Solubilizing Group and Backbone Planarity in Low Band Gap Polymers for High Performance Ambipolar field-effect Transistors, Chem. Mater. 2012, 24, 1316-1323.

J. C. Bijleveld et al., Copolymers of diketopyrrolopyrrole and thienothiophene for photovoltaic cells, J. Mater. Chem., 2011, 21, 9224-9231.

Y. Li et al., Poly(2,5-bis(2-octyldodecyl)-3,6-di(furan-2-yl)-2,5-dihydro-pyrrolo[3,4-c]-pyrrole-1,4-dione-co-thieno[3,2-b]thiophene): a high performance polymer semiconductor for both organic thin film transistors and organic photovoltaics, Phys. Chem. Chem. Phys., 2012, 14, 7162-7169.

WO 2011/156478A2, Polymers with Tunable Band Gaps for Photonic and Electronic Applications.

WO 2006/021277A1, Monomers, Oligomers and Polymers of thieno[2,3-b]thiophene.

WO 2011/025453A1, Polymeric Semiconductors, Devices, and Related Methods.

L. Biniek et al., Electronic Properties and Photovoltaic Performances of a Series of Oligothiophene Copolymers Incorporating Both Thieno[3,2-b]thiophene and 2,1,3-Benzothiadiazole Moieties, Macromol. Rapid Commun. 2010, 31, 651-656.

S. Zhang et al., Low Bandgap p-Conjugated Copolymers Based on Fused Thiophenes and Benzothiadiazole: Synthesis and Structure-Property Relationship Study, J. Poly. Sci. Part A 2009, 47, 5498-5508.

Ming Wang et al., Donor-Acceptor Conjugated Polymer Based on Naphtho[1,2-c:5,6-c]bis[1,2,5]thiadiazole for High-Performance Polymer Solar Cells, J. Am. Chem. Soc. 2011, 133, 9638-9641.

L. Biniek et al., A [3,2-b]thienothiophene-alt-benzothiadiazole copolymer for photovoltaic applications: design, synthesis, material characterization and device performances, J. Mater. Chem., 2009, 19, 4946-4951.

What is claimed is:

1. A polymer of formula I:

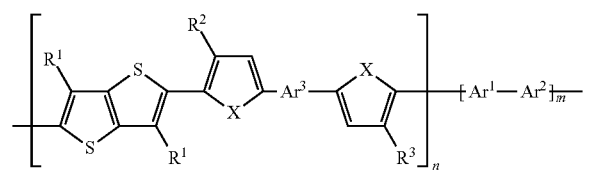

wherein:

$Ar^1$ is selected from:

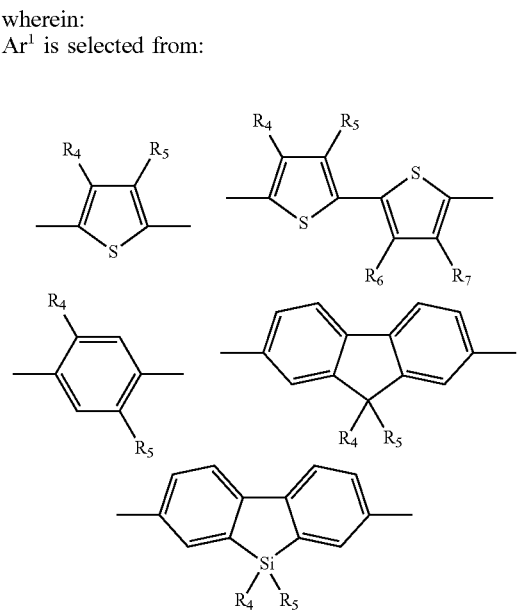

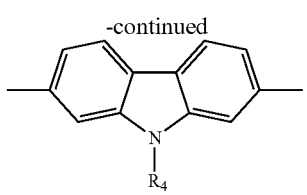

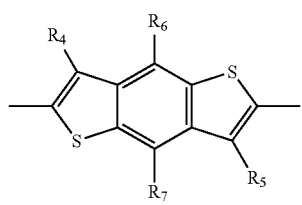

$Ar^2$ is selected from:

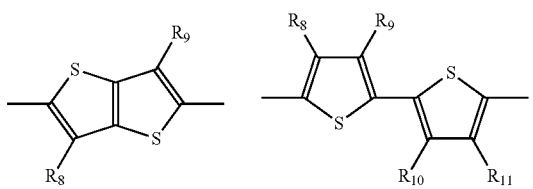

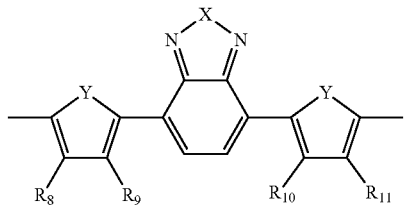

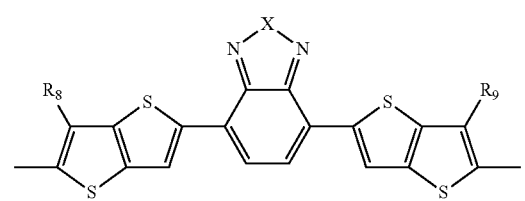

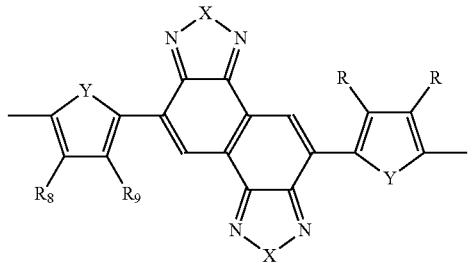

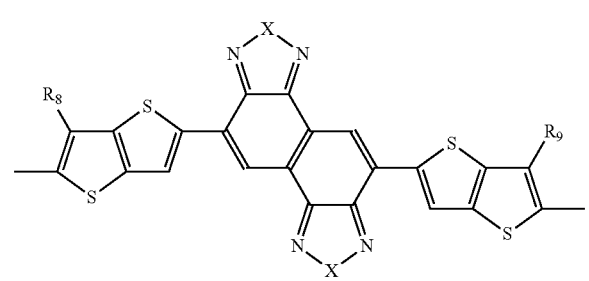

-continued

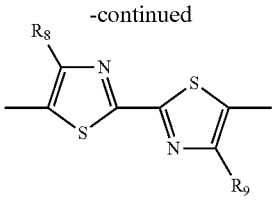

Ar³ is selected from

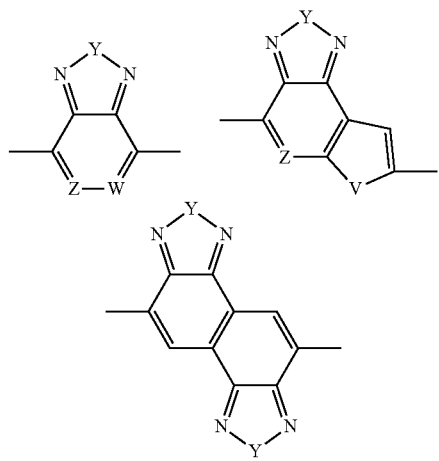

V is selected from O, S, N, Se, C—R¹², C═C, C═N and N═C;

X and Y are each independently selected from O, S, Se and N;

W and Z are each independently selected from C—R¹² and N;

each occurrence of R¹ (of 2 n total occurrences) is each independently selected from H, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms;

each occurrence of each of R, R⁴, R⁵, R⁶, R⁷, R⁸, R⁹, R¹⁰ and R¹¹ (of m or 2m total occurrences) is each independently selected from straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms;

each occurrence of R², R³ and R¹² (of n total occurrences) is each independently selected from H, halide, straight or branched alkyl having from 1 to 60 backbone atoms, straight or branched alkenyl having from 2 to60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms;

n is an integer from 10 to 1000;

m is an integer from 1 to 1000; and the ratio of m:n is from about 0.01 to about 1.

2. The polymer of claim 1, wherein (i) the monomers containing Ar³ and the monomers containing Ar¹ and Ar² are randomly arranged in the polymer; or (ii) the monomers containing Ar³ and the monomers containing Ar¹ and Ar² are arranged in blocks in the polymer.

3. A polymer of formula I-2:

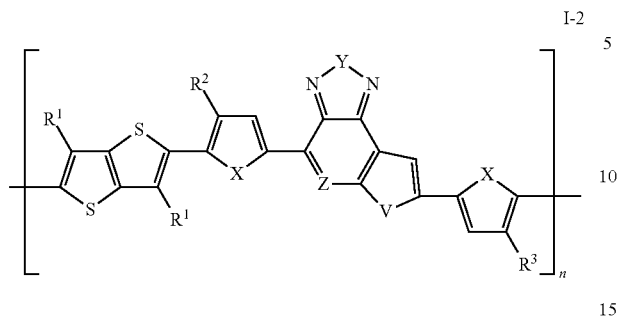

wherein:
V is selected from O, S, N, Se, C—R$^{12}$, C≡C, C=N and N=C;
X and Y are each independently selected from O, S, Se and N;
Z is selected from C—R$^{12}$ and N;
each occurrence of R$^1$ (of 2 n total occurrences) is each independently selected from H, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms;
each occurrence of R$^2$, R$^3$ and R$^{12}$ (of n total occurrences) is each independently selected from H, halide, straight or branched alkyl having from 1 to 60 backbone atoms, straight or branched alkenyl having from 2 to 60 backbone atoms, straight or branched alkynyl having from 2 to 60 backbone atoms, straight or branched arylalkyl having from 6 to 60 backbone atoms, straight or branched arylalkenyl having from 7 to 60 backbone atoms, straight or branched arylalkynyl having from 7 to 60 backbone atoms, straight or branched alkoxy having from 2 to 60 backbone atoms, straight or branched alkenyloxy having from 3 to 60 backbone atoms, straight or branched alkynyloxy having from 3 to 60 backbone atoms, straight or branched arylalkoxy having from 7 to 60 backbone atoms, straight or branched arylalkenyloxy having from 8 to 60 backbone atoms, straight or branched arylalkynyloxy having from 8 to 60 backbone atoms, straight or branched alkylamino having from 2 to 60 backbone atoms, straight or branched alkenylamino having from 3 to 60 backbone atoms, straight or branched alkynylamino having from 3 to 60 backbone atoms, straight or branched arylalkylamino having from 7 to 60 backbone atoms, straight or branched arylalkenylamino having from 8 to 60 backbone atoms, straight or branched arylalkynylamino having from 8 to 60 backbone atoms, straight or branched ester having from 2 to 60 backbone atoms, straight or branched carbonyl having from 1 to 60 backbone atoms; and
n is an integer from 10 to 1000.

4. The polymer of claim 3, wherein R$^1$ is not H.

5. The polymer of claim 3, wherein the polymer has one of the following formulas:

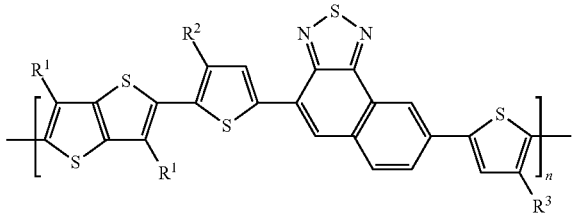
(2a)

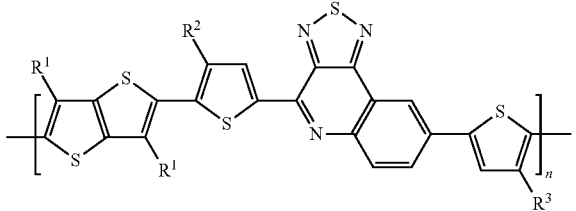
(2b)

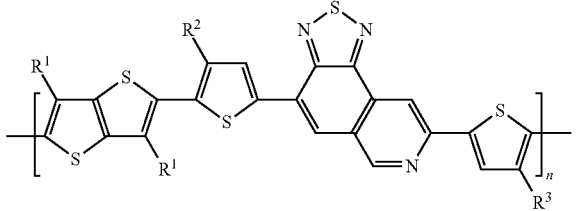
(2c)

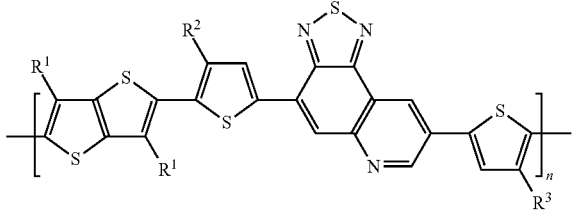
(2d)

(2e)
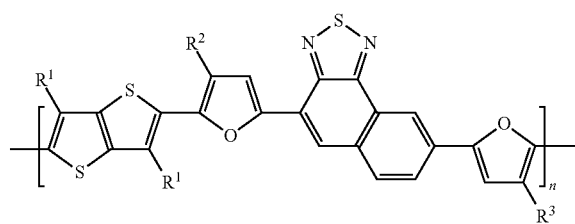
(2i)
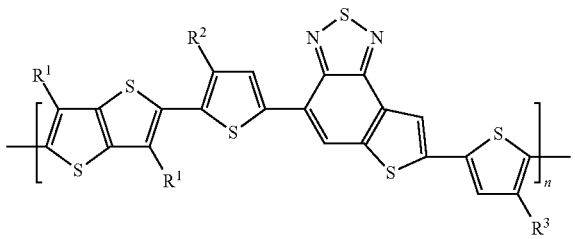
(2f)
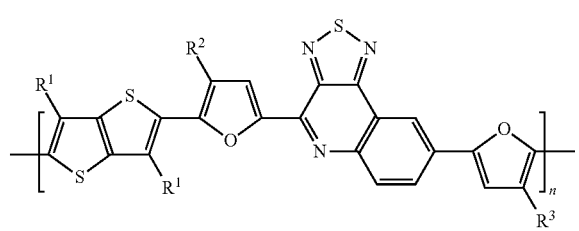
(2j)
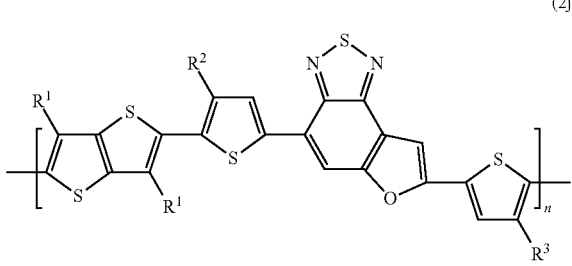
(2g)
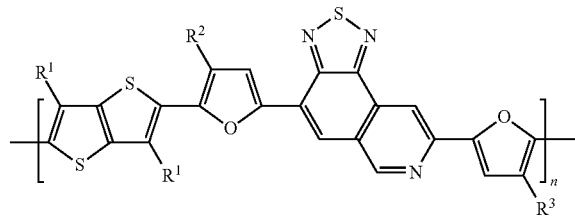
(2k)
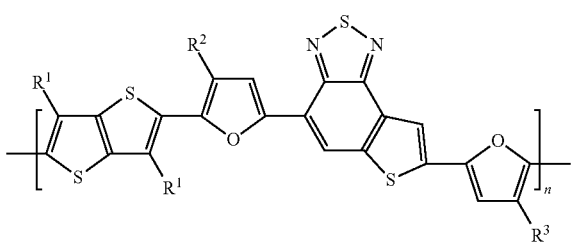
(2h)
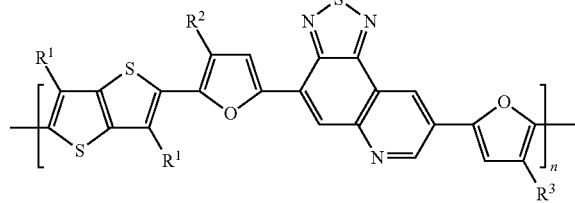
(2l)
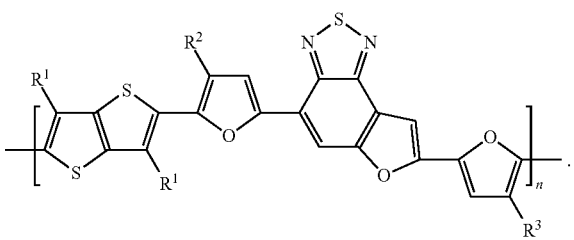
6. The polymer of claim 1, wherein the polymer has formula I-4:
I-4
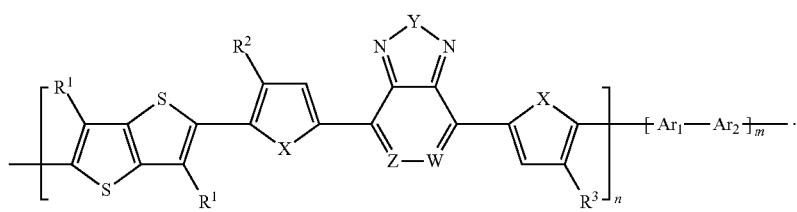

7. The polymer of claim 6, wherein the polymer has one of the following formulas:
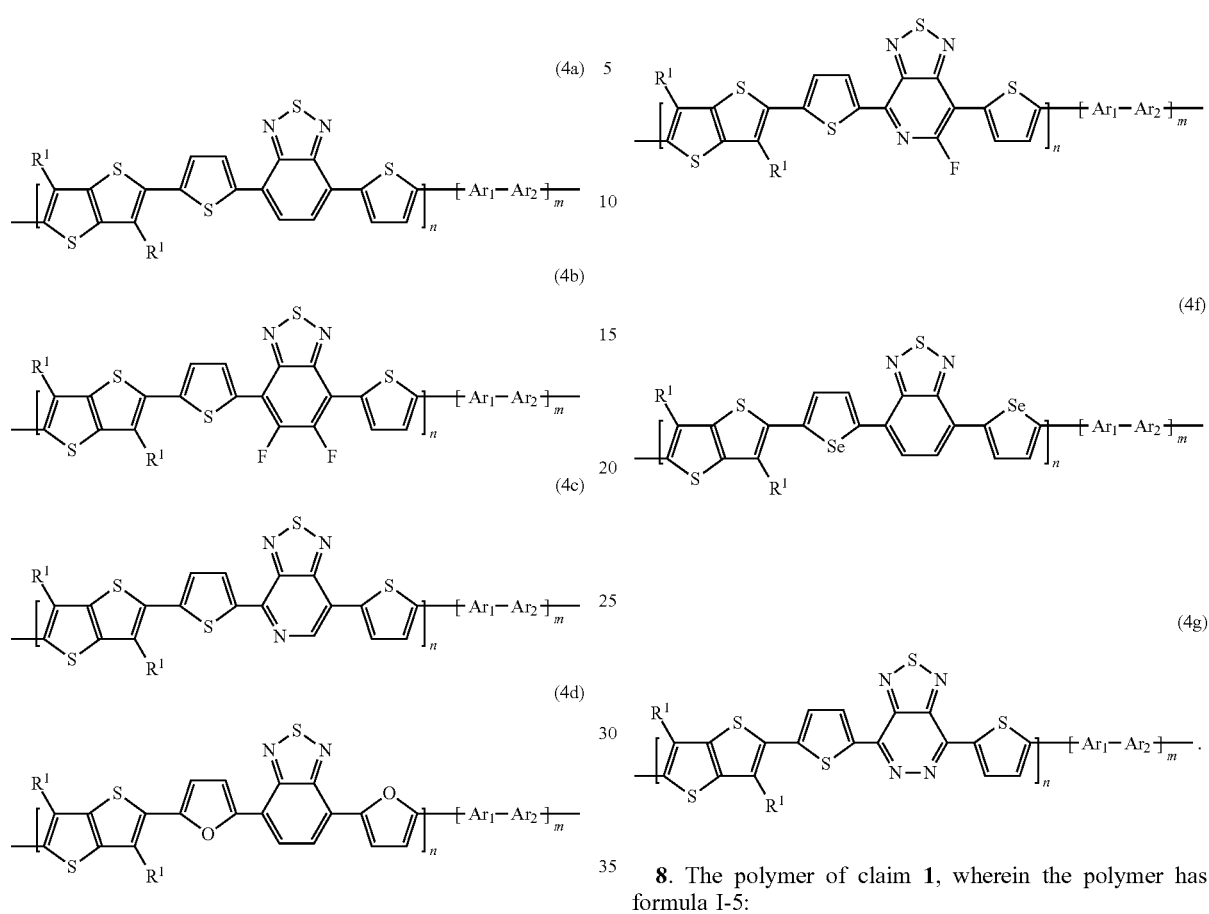
8. The polymer of claim 1, wherein the polymer has formula I-5:
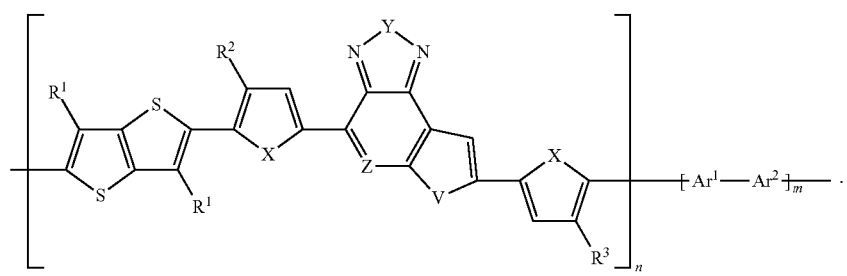
9. The polymer of claim 8, wherein the polymer has one of the following formulas:
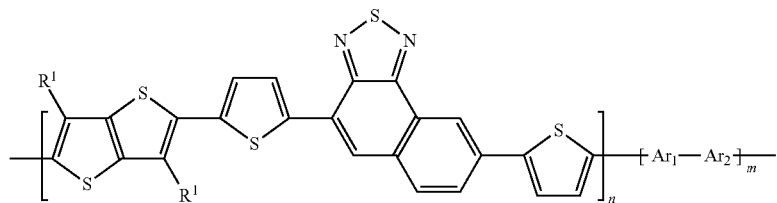

-continued
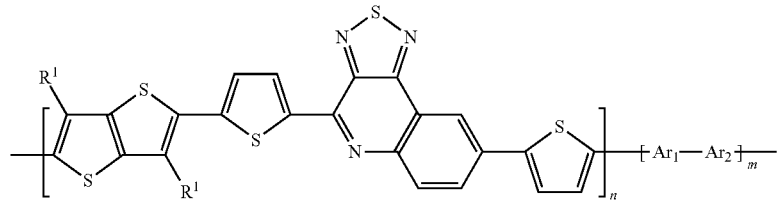
(5b)
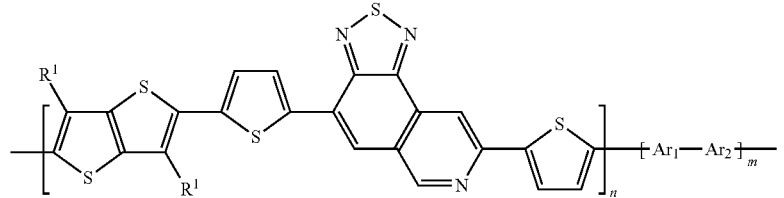
(5c)
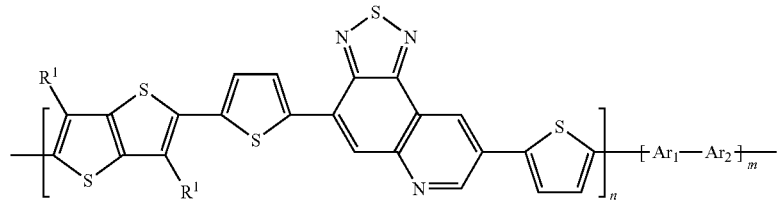
(5d)
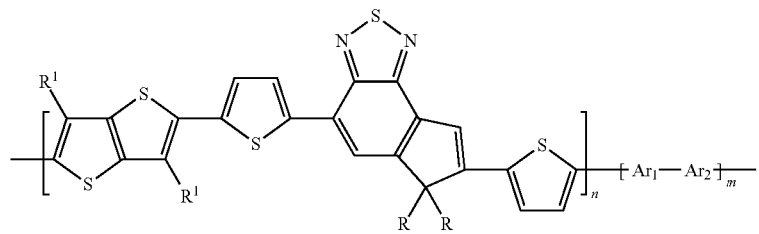
R: alkyl group, or R, R = O
(5e)
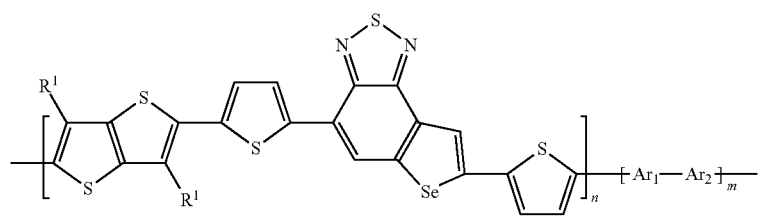
(5f)
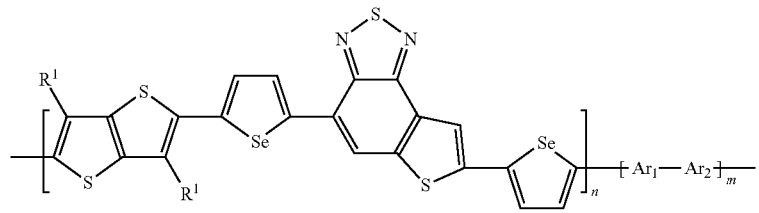
(5g)
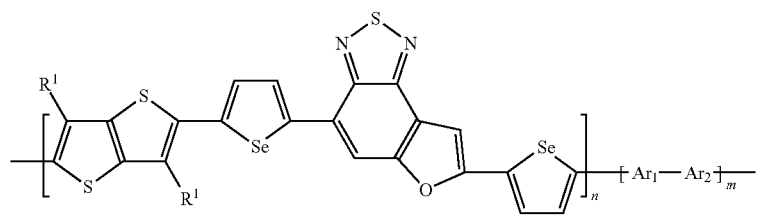
(5h)

-continued
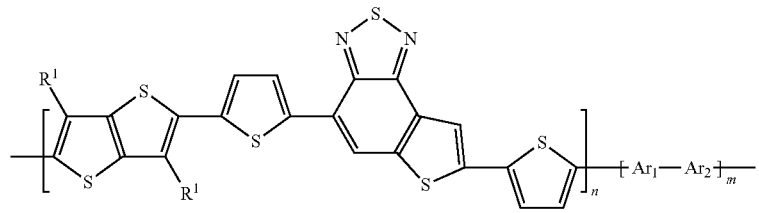
(5i)
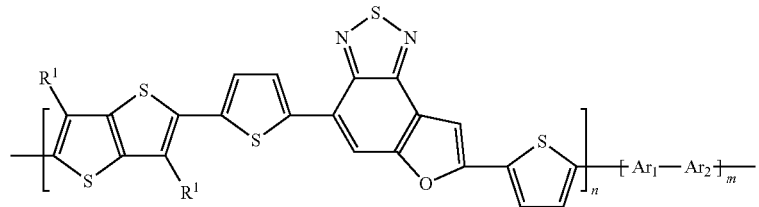
(5j)
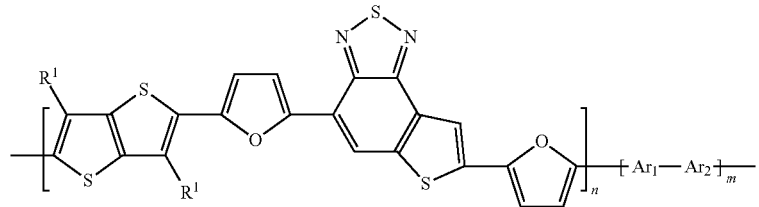
(5k)
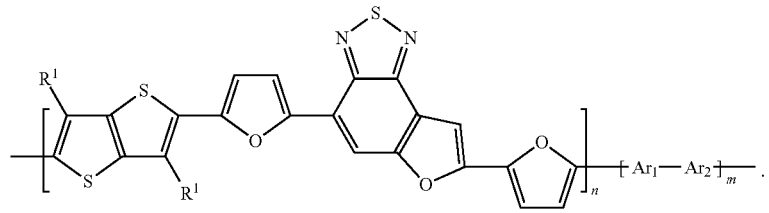
(5l)
* * * * *